US012272675B2

(12) United States Patent
Manipatruni et al.

(10) Patent No.: US 12,272,675 B2
(45) Date of Patent: *Apr. 8, 2025

(54) METHOD OF FORMING 3D STACKED COMPUTE AND MEMORY WITH COPPER PILLARS

(71) Applicant: Kepler Computing Inc., San Francisco, CA (US)

(72) Inventors: Sasikanth Manipatruni, Portland, OR (US); Rajeev Kumar Dokania, Beaverton, OR (US); Amrita Mathuriya, Portland, OR (US); Ramamoorthy Ramesh, Moraga, CA (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/358,552

(22) Filed: Jul. 25, 2023

(65) Prior Publication Data

US 2024/0047426 A1 Feb. 8, 2024

Related U.S. Application Data

(63) Continuation of application No. 17/472,325, filed on Sep. 10, 2021, now Pat. No. 11,764,190, which is a (Continued)

(51) Int. Cl.
H01L 25/065 (2023.01)
G06F 9/50 (2006.01)
(Continued)

(52) U.S. Cl.
CPC ........ *H01L 25/0657* (2013.01); *G06F 9/5077* (2013.01); *G11C 7/1006* (2013.01); (Continued)

(58) Field of Classification Search
CPC .... H01L 25/0657; H01L 23/525; H01L 24/73
See application file for complete search history.

(56) References Cited

U.S. PATENT DOCUMENTS 5,834,162 A 11/1998 Malba
6,256,248 B1 7/2001 Leung
(Continued)

FOREIGN PATENT DOCUMENTS

CN 104081516 A 10/2014
CN 104081516 B 2/2017
(Continued)

OTHER PUBLICATIONS

Non-Final Office Action notified Mar. 23, 2021 for U.S. Appl. No. 16/357,272.
(Continued)

*Primary Examiner* — Christine A Enad
(74) *Attorney, Agent, or Firm* — MUGHAL GAUDRY & FRANKLIN PC

(57) ABSTRACT

Described is a packaging technology to improve performance of an AI processing system. An IC package is provided which comprises: a substrate; a first die on the substrate, and a second die stacked over the first die. The first die includes memory and the second die includes computational logic. The first die comprises a ferroelectric RAM (FeRAM) having bit-cells. Each bit-cell comprises an access transistor and a capacitor including ferroelectric material. The access transistor is coupled to the ferroelectric material. The FeRAM can be FeDRAM or FeSRAM. The memory of the first die may store input data and weight factors. The computational logic of the second die is coupled to the memory of the first die. The second die is an inference die that applies fixed weights for a trained model to an input data
(Continued)

to generate an output. In one example, the second die is a training die that enables learning of the weights.

7 Claims, 18 Drawing Sheets

Related U.S. Application Data continuation of application No. 16/357,265, filed on Mar. 18, 2019, now Pat. No. 11,139,270.

(51) Int. Cl.
    *G11C 7/10*           (2006.01)
    *G11C 11/419*       (2006.01)
    *H01L 23/00*        (2006.01)
    *H01L 23/525*       (2006.01)
    *H10B 10/00*       (2023.01)

(52) U.S. Cl.
    CPC .......... *G11C 11/419* (2013.01); *H01L 23/525* (2013.01); *H01L 24/73* (2013.01); *H10B 10/00* (2023.02); *H01L 2224/32145* (2013.01)

(56) References Cited

U.S. PATENT DOCUMENTS

| | | |
|---|---|---|
| 6,487,135 B2 | 11/2002 | Watanabe et al. |
| 6,890,798 B2 | 5/2005 | McMahon |
| 7,146,454 B1 | 12/2006 | Li et al. |
| 7,217,596 B2 | 5/2007 | Cobbley et al. |
| 7,683,459 B2 | 3/2010 | Ma et al. |
| 7,992,017 B2 | 8/2011 | Safford et al. |
| 8,143,710 B2 | 3/2012 | Cho |
| 8,198,716 B2 | 6/2012 | Periaman et al. |
| 8,245,065 B2 | 8/2012 | Niggemeier et al. |
| 8,525,342 B2 | 9/2013 | Chandrasekaran et al. |
| 8,546,955 B1 | 10/2013 | Wu |
| 8,547,769 B2 | 10/2013 | Saraswat et al. |
| 8,612,809 B2 | 12/2013 | Casper et al. |
| 8,701,073 B1 | 4/2014 | Fu et al. |
| 8,759,899 B1 | 6/2014 | Lue et al. |
| 8,896,126 B2 | 11/2014 | Setardja |
| 8,947,931 B1 | 2/2015 | d'Abreu |
| 9,165,968 B2 | 10/2015 | Chao et al. |
| 9,379,078 B2 | 6/2016 | Yu et al. |
| 9,627,365 B1 | 4/2017 | Yu et al. |
| 9,748,190 B2 | 8/2017 | Chen et al. |
| 10,074,423 B1 | 9/2018 | Hermesh et al. |
| 10,461,076 B1 | 10/2019 | Brewer |
| 10,741,525 B2 | 8/2020 | Takishita et al. |
| 11,009,938 B1 | 5/2021 | Law et al. |
| 11,043,472 B1 | 6/2021 | Dokania et al. |
| 11,139,270 B2 * | 10/2021 | Manipatruni ....... H01L 25/0655 |
| 11,152,343 B1 | 10/2021 | Dokania et al. |
| 11,171,115 B2 | 11/2021 | Manipatruni et al. |
| 11,238,206 B1 | 2/2022 | Sivaswamy et al. |
| 11,309,895 B2 | 4/2022 | Dabral et al. |
| 11,436,402 B1 | 9/2022 | Liu et al. |
| 11,488,935 B1 | 11/2022 | Zaman et al. |
| 11,694,940 B1 | 7/2023 | Mathuriya et al. |
| 2003/0097543 A1 | 5/2003 | Wishneusky |
| 2006/0179329 A1 | 8/2006 | Terechko et al. |
| 2007/0208902 A1 | 9/2007 | Park et al. |
| 2007/0234094 A1 | 10/2007 | Samra et al. |
| 2008/0126611 A1 | 5/2008 | Tu et al. |
| 2009/0019411 A1 | 1/2009 | Chandra et al. |
| 2009/0103854 A1 | 4/2009 | Beausoleil et al. |
| 2010/0008058 A1 | 1/2010 | Saen et al. |
| 2010/0057404 A1 | 3/2010 | Dittmann et al. |
| 2010/0077179 A1 | 3/2010 | Stillwell, Jr. et al. |
| 2010/0167467 A1 | 7/2010 | Aoi |
| 2010/0228955 A1 | 9/2010 | Niggemeier et al. |
| 2010/0321993 A1 | 12/2010 | Nikonov et al. |
| 2011/0222540 A1 | 9/2011 | Mital et al. |
| 2012/0098140 A1 | 4/2012 | Bartley et al. |
| 2012/0106117 A1 | 5/2012 | Sundaram et al. |
| 2012/0146207 A1 | 6/2012 | Chou et al. |
| 2012/0239904 A1 | 9/2012 | Ekanadham et al. |
| 2013/0086395 A1 | 4/2013 | Liu |
| 2013/0141442 A1 | 6/2013 | Brothers et al. |
| 2013/0141858 A1 | 6/2013 | Pyeon |
| 2013/0175686 A1 | 7/2013 | Meyer et al. |
| 2013/0205143 A1 | 8/2013 | Eastlack |
| 2013/0320560 A1 | 12/2013 | Secker et al. |
| 2013/0346781 A1 | 12/2013 | Chung et al. |
| 2014/0006817 A1 | 1/2014 | Bonen et al. |
| 2014/0026146 A1 | 1/2014 | Jahagirdar et al. |
| 2014/0208041 A1 * | 7/2014 | Hyde ................... G11C 7/1006 |
| | | 711/146 |
| 2014/0217604 A1 | 8/2014 | Chou et al. |
| 2014/0217616 A1 | 8/2014 | Choi |
| 2014/0371109 A1 | 12/2014 | McMillen et al. |
| 2015/0091131 A1 * | 4/2015 | Lamorey ............ H01L 25/0657 |
| | | 257/532 |
| 2015/0277532 A1 | 10/2015 | Mishaeli et al. |
| 2015/0279431 A1 | 10/2015 | Li et al. |
| 2016/0126291 A1 | 5/2016 | Lu et al. |
| 2016/0218081 A1 * | 7/2016 | Kim ........................ H01L 24/20 |
| 2016/0357630 A1 | 12/2016 | Kang et al. |
| 2017/0018301 A1 | 1/2017 | Kilmer et al. |
| 2017/0062383 A1 * | 3/2017 | Yee ..................... H01L 23/3675 |
| 2017/0077387 A1 | 3/2017 | Kan et al. |
| 2017/0084312 A1 | 3/2017 | Kim |
| 2017/0084596 A1 | 3/2017 | Scanlan |
| 2017/0139635 A1 | 5/2017 | Jayasena et al. |
| 2017/0178711 A1 | 6/2017 | Morris et al. |
| 2017/0300269 A1 | 10/2017 | Um et al. |
| 2018/0082981 A1 | 3/2018 | Gowda et al. |
| 2018/0095750 A1 | 4/2018 | Drysdale et al. |
| 2018/0107630 A1 | 4/2018 | Zhou et al. |
| 2018/0240964 A1 | 8/2018 | Nikonov et al. |
| 2018/0254073 A1 | 9/2018 | Frans |
| 2018/0277695 A1 | 9/2018 | Garten et al. |
| 2018/0330236 A1 | 11/2018 | Hou et al. |
| 2018/0350773 A1 | 12/2018 | Saito |
| 2019/0042251 A1 | 2/2019 | Nurvitadhi et al. |
| 2019/0050040 A1 | 2/2019 | Baskaran et al. |
| 2019/0051642 A1 | 2/2019 | Hyde et al. |
| 2019/0065204 A1 | 2/2019 | Jean |
| 2019/0065956 A1 | 2/2019 | Qian et al. |
| 2019/0096453 A1 | 3/2019 | Shin et al. |
| 2019/0102330 A1 | 4/2019 | Hasbun et al. |
| 2019/0103143 A1 | 4/2019 | Hasbun et al. |
| 2019/0103148 A1 | 4/2019 | Hasbun et al. |
| 2019/0114535 A1 | 4/2019 | Ng et al. |
| 2019/0164834 A1 | 5/2019 | Or-Bach et al. |
| 2019/0187898 A1 | 6/2019 | Gu et al. |
| 2019/0189564 A1 | 6/2019 | Guzek |
| 2019/0198083 A1 | 6/2019 | Biswas et al. |
| 2019/0205244 A1 | 7/2019 | Smith |
| 2019/0220434 A1 | 7/2019 | Dai et al. |
| 2019/0229101 A1 | 7/2019 | Lee |
| 2019/0259732 A1 | 8/2019 | Choo et al. |
| 2019/0267074 A1 | 8/2019 | Fishburn et al. |
| 2019/0279697 A1 | 9/2019 | Karpov et al. |
| 2019/0317585 A1 | 10/2019 | Bhandaru et al. |
| 2019/0318975 A1 | 10/2019 | Shi et al. |
| 2019/0334010 A1 | 10/2019 | Avci et al. |
| 2020/0006324 A1 | 1/2020 | Chen et al. |
| 2020/0075567 A1 | 3/2020 | Collins |
| 2020/0076424 A1 | 3/2020 | Dubey et al. |
| 2020/0097417 A1 | 3/2020 | Malladi et al. |
| 2020/0098725 A1 | 3/2020 | Liff et al. |
| 2020/0107444 A1 | 4/2020 | Hoe et al. |
| 2020/0126995 A1 | 4/2020 | Ge et al. |
| 2020/0135697 A1 | 4/2020 | Brewer |
| 2020/0159568 A1 | 5/2020 | Goyal et al. |
| 2020/0161230 A1 | 5/2020 | Knickerbocker et al. |
| 2020/0168528 A1 | 5/2020 | Cheah et al. |
| 2020/0168550 A1 | 5/2020 | Ryu et al. |
| 2020/0168554 A1 | 5/2020 | Fay et al. |
| 2020/0279793 A1 | 9/2020 | Xie et al. |
| 2020/0303343 A1 | 9/2020 | Manipatruni et al. |

(56) References Cited

U.S. PATENT DOCUMENTS

| | | |
|---|---|---|
| 2020/0303344 A1 | 9/2020 | Manipatruni et al. |
| 2020/0334082 A1 | 10/2020 | Zhao et al. |
| 2020/0365593 A1 | 11/2020 | Chen et al. |
| 2021/0134724 A1 | 5/2021 | Rubin et al. |
| 2021/0160061 A1 | 5/2021 | Liu et al. |
| 2021/0166740 A1 | 6/2021 | Shin et al. |
| 2021/0311629 A1 | 10/2021 | Pappachan et al. |
| 2021/0335718 A1 | 10/2021 | Cheah et al. |
| 2021/0391469 A1 | 12/2021 | Doornbos et al. |
| 2022/0367400 A1 | 11/2022 | Li |
| 2023/0004324 A1 | 1/2023 | Lim et al. |
| 2023/0086010 A1 | 3/2023 | Gonzalez et al. |

FOREIGN PATENT DOCUMENTS

| | | | |
|---|---|---|---|
| GB | 2323188 | A | 9/1998 |
| JP | H11168185 | A | 6/1999 |
| JP | 2000196008 | A | 7/2000 |
| JP | 2004315268 | A | 11/2004 |
| JP | 2006324430 | A | 11/2006 |
| JP | 2007150154 | | 1/2009 |
| JP | 2010053399 | A | 3/2010 |
| JP | 2018160490 | A | 10/2018 |
| KR | 20100081272 | A | 7/2010 |
| KR | 20150024489 | A | 3/2015 |
| KR | 20200066538 | A | 6/2020 |
| TW | 201327740 | A | 7/2013 |
| TW | 201430968 | A | 8/2014 |
| TW | 201523827 | A | 6/2015 |
| TW | 201843782 | A | 12/2018 |
| WO | 2018126073 | A1 | 7/2018 |
| WO | 2018220846 | A1 | 12/2018 |
| WO | 2019023253 | A1 | 1/2019 |
| WO | 2020062312 | A1 | 4/2020 |

OTHER PUBLICATIONS

Non-Final Office Action notified Mar. 24, 2023 for U.S. Appl. No. 17/408,326.
Non-Final Office Action notified May 9, 2023 for U.S. Appl. No. 17/408,323.
Non-Final Office Action notified May 15, 2023 for U.S. Appl. No. 17/472,330.
Non-Final Office Action notified May 24, 2022 for U.S. Appl. No. 16/823,209.
Non-Final Office Action notified Oct. 5, 2022 for U.S. Appl. No. 17/472,308.
Non-Final Office Action notified Oct. 6, 2022 for U.S. Appl. No. 17/472,325.
Non-Final Office Action notified Sep. 3, 2020 for U.S. Appl. No. 16/428,885.
Non-Final Office Action notified Sep. 3, 2020 for U.S. Appl. No. 16/428,893.
Non-Final Office Action notified Sep. 26, 2022 for U.S. Appl. No. 17/390,829.
Notice of Allowance notified Apr. 13, 2023 for U.S. Appl. No. 17/478,841.
Notice of Allowance notified Feb. 22, 2021 for U.S. Appl. No. 16/428,885.
Notice of Allowance notified Jul. 9, 2021 for U.S. Appl. No. 16/428,893.
Notice of Allowance notified Jul. 12, 2023 for U.S. Appl. No. 16/823,209.
Notice of Allowance notified Jul. 12, 2023 for U.S. Appl. No. 17/499,241.
Notice of Allowance notified Jul. 22, 2021 for U.S. Appl. No. 16/357,265.
Notice of Allowance notified Jul. 22, 2021 for U.S. Appl. No. 16/357,272.
Notice of Allowance notified Jun. 6, 2023 for U.S. Appl. No. 17/472,308.
Notice of Allowance notified Jun. 6, 2023 for U.S. Appl. No. 17/472,325.
Notice of Allowance notified Jun. 7, 2023 for U.S. Appl. No. 17/396,585.
Notice of Allowance notified Jun. 29, 2023 for U.S. Appl. No. 17/407,094.
Notice of Allowance notified May 10, 2023 for U.S. Appl. No. 17/396,585.
Notice of Allowance notified Nov. 23, 2022 for U.S. Appl. No. 17/390,829.
Notice of Allowance notified Sep. 21, 2022 for Taiwan Patent Application No. 109106755.
Notice of Allowance notified Sep. 28, 2022 for U.S. Appl. No. 17/390,799.
Notice of Reasons for Rejection notified Nov. 8, 2022 for Japanese Patent Application No. 2021-546863.
Office Action notified Feb. 21, 2023 for Japanese Patent Application No. 2021-546863.
Office Action notified May 8, 2023 for Taiwan Patent Application No. 111129893.
Prasad et al. "Buried power rails and back-side power grids: Arm® CPU power delivery network design beyond 5nm." 2019 IEEE International Electron Devices Meeting (IEDM). IEEE, 2019.
Pugsley et al., "NDC: Analyzing the impact of 3D-stacked memory+ logic devices on MapReduce workloads", 2014 IEEE International Symposium on Performance Analysis of Systems and Software (ISPASS), Monterey, CA, 2014, pp. 190-200.
Restriction Requirement notified Apr. 3, 2020 for U.S. Appl. No. 16/428,885.
Restriction Requirement notified Apr. 3, 2020 for U.S. Appl. No. 16/428,893.
Restriction Requirement notified Dec. 13, 2019 for U.S. Appl. No. 16/357,265.
Restriction Requirement notified Feb. 8, 2023 for U.S. Appl. No. 17/229,750.
Restriction Requirement notified Jan. 2, 2020 for U.S. Appl. No. 16/357,272.
Restriction Requirement notified May 1, 2023 for U.S. Appl. No. 17/230,889.
Rotem et al. "Power-management architecture of the intel microarchitecture code-named sandy bridge." IEEE micro 32.2 (2012): 20-27.
Shulaker et al., "Monolithic 3D integration of logic and memory: Carbon nanotube FETs, resistive RAM, and silicon FETs", 2014 IEEE International Electron Devices Meeting, San Francisco, CA, 2014, p. 27.4.1-27.4.4.
Sun et al., "A novel architecture of the 3D stacked Mram L2 cache for CMPs", 2009 IEEE 15th International Symposium on High Performance Computer Architecture, Raleigh, NC, 2009, pp. 239-249.
Wikipedia. Ferroelectric RAM. retrieved from the Internet by USPTO Feb. 21, 2023, https://en.wikipedia.org/wiki/Ferroelectric_RAM, 8 pages.
Woo et al., "An optimized 3D-stacked memory architecture by exploiting excessive, high-density TSV bandwidth", HPCA—16 2010 The Sixteenth International Symposium on High-Performance Computer Architecture, Bangalore, 2010, pp. 1-12.
Yu, "Wafer level system integration for SiP", 2014 IEEE International Electron Devices Meeting, San Francisco, CA, 2014, pp. 27.1.1-27.1.4.
1st Office Action & Search Report notified Dec. 9, 2020, for Taiwan Patent Application No. 109106755.
Advisory Action notified Jan. 5, 2023 for U.S. Appl. No. 16/823,209.
Advisory Action notified Jun. 14, 2023 for U.S. Appl. No. 16/823,209.
Advisory Action notified Mar. 3, 2021 for U.S. Appl. No. 16/357,265.
Advisory Action notified Mar. 3, 2021 for U.S. Appl. No. 16/357,272.
Advisory Action notified Mar. 15, 2023 for U.S. Appl. No. 17/472,308.
Advisory Action notified Mar. 15, 2023 for U.S. Appl. No. 17/472,325.
AMD CDNA whitepaper. Retrieved from https://www.amd.com/system/files/documents/amd-cdna-whitepaper.pdf [Sep. 14, 2021].
AMD's V-cache product announcement. Retrieved from https://www.pcworld.com/article/3620871/amd-v-cache-for-ryzen-everything-you-need-to-know.html [Sep. 14, 2021].

(56) References Cited

OTHER PUBLICATIONS

Application and Figures as filed for U.S. Appl. No. 17/129,842 on Dec. 21, 2020.
Application and Figures as filed for U.S. Appl. No. 17/327,614 on May 21, 2021.
Application and Figures as filed for U.S. Appl. No. 17/327,648 on May 21, 2021.
Application and Figures as filed for U.S. Appl. No. 17/384,626 on Jul. 28, 2021.
Chen et al. "System on integrated chips (SoIC (TM) for 3D heterogeneous integration." 2019 IEEE 69th Electronic Components and Technology Conference (ECTC). IEEE, 2019.
Chen et al. "Ultra high density SoIC with sub-micron bond pitch." 2020 IEEE 70th Electronic Components and Technology Conference (ECTC). IEEE, 2020.
Coskun et al., "Temperature- and Cost-Aware Design of 3D Multiprocessor Architectures," 2009 12th Euromicro Conference on Digital System Design, Architectures, Methods and Tools, Patras, Greece, 2009, pp. 183-190, doi: 10.1109/DSD.2009.233 (8 pages).
Decision of Rejection notified May 18, 2021 for Taiwan Patent Application No. 109106755.
Final Office Action notified Apr. 17, 2023 for U.S. Appl. No. 17/499,241.
Final Office Action notified Apr. 19, 2023 for U.S. Appl. No. 16/823,209.
Final Office Action notified Dec. 28, 2020 for U.S. Appl. No. 16/357,265.
Final Office Action notified Dec. 31, 2020 for U.S. Appl. No. 16/357,272.
Final Office Action notified Feb. 14, 2023 for U.S. Appl. No. 17/472,308.
Final Office Action notified Feb. 14, 2023 for U.S. Appl. No. 17/472,325.
Final Office Action notified Oct. 17, 2022 for U.S. Appl. No. 16/823,209.
First Office Action in Re-Examination notified Jul. 11, 2022 for Taiwan Patent Application No. 109106755.
Herbert et al., "Analysis of dynamic voltage/frequency scaling in chip-multiprocessors." Proceedings of the 2007 international symposium on Low power electronics and design (ISLPED'07). IEEE, 2007.
Ingerly et al. "Foveros: 3D integration and the use of face-to-face chip stacking for logic devices." 2019 IEEE International Electron Devices Meeting (IEDM). IEEE, 2019.
International Preliminary Report on Patentability notified Dec. 9, 2021 for PCT Patent Application No. PCT/US2020/032974.
International Preliminary Report on Patentability notified Sep. 30, 2021 for PCT Patent Application No. PCT/US2020/018875.
International Search Report & Written Opinion notified Jun. 11, 2020 for PCT Patent Application No. PCT/US2020/018875.
International Search Report & Written Opinion notified Sep. 1, 2020 for PCT Patent Application No. PCT/US2020/032974.
Jun, H. et al., "HBM (High Bandwidth Memory) DRAM Technology and Architecture," 2017 IEEE International Memory Workshop (IMW), Monterey, CA, 2017, pp. 1-4.
Kim, J. et al., "A 1.2 V 12.8 GB/s 2 GB Mobile Wide-I/O DRAM With 4\$\times\$128 I/Os Using TSV Based Stacking", IEEE Journal of Solid-State Circuits, vol. 47, No. 1, pp. 107-116, Jan. 2012.
Koob et al., "Design of a 3-D fully depleted SOI computational RAM," in IEEE Transactions on Very Large Scale Integration ( VLSI) Systems, vol. 13, No. 3, pp. 358-369, Mar. 2005, doi: 10.1109/TVLSI.2004.842890 (12 pages).
Leblebici, Y., et al. "A compact high-speed (31, 5) parallel counter circuit based on capacitive threshold-logic gates." IEEE Journal of Solid-State Circuits 31.8 (1996): 1177-1183.
Lee et al. "Heterogeneous System-Level Package Integration-Trends and Challenges." 2020 IEEE Symposium on VLSI Technology. IEEE, 2020.
Lee, D. et al., "A 1.2V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.
Lent et al. "Quantum cellular automata." Nanotechnology 4.1 (1993): 49.
Lewis et al., "Testing Circuit-Partitioned 3D Ic Designs," 2009 IEEE Computer Society Annual Symposium on VLSI, Tampa, FL, USA, 2009, pp. 139-144, doi: 10.1109/ISVLSI.2009.48 (6 pages).
Lexinnova, 3D Stacked Memory, retrieved from the Internet by USPTO at. 2017. 23 pages.
Macri, "AMD's next generation GPU and high bandwidth memory architecture: FURY", 2015 IEEE Hot Chips 27 Symposium (HCS), Cupertino, CA, 2015, pp. 1-26.
Manipatruni et al. "Scalable energy-efficient magnetoelectric spin-orbit logic." Nature 565.7737 (2019): 35-42.
Non-Final Office Action notified Apr. 20, 2023 for U.S. Appl. No. 17/472,308.
Non-Final Office Action notified Apr. 20, 2023 for U.S. Appl. No. 17/472,325.
Non-Final Office Action notified Jan. 31, 2023 for U.S. Appl. No. 16/823,209.
Non-Final Office Action notified Jul. 6, 2023 for U.S. Appl. No. 17/229,50.
Non-Final Office Action notified Jul. 20, 2020 for U.S. Appl. No. 16/357,272.
Non-Final Office Action notified Jul. 22, 2020 for U.S. Appl. No. 16/357,265.
Non-Final Office Action notified Mar. 3, 2023 for U.S. Appl. No. 17/449,240.
Non-Final Office Action notified Mar. 22, 2021 for U.S. Appl. No. 16/357,265.
2nd Office Action notified Apr. 10, 2024 for Taiwan Patent Application No. 112147200.
Advisory Action notified Feb. 14, 2024 for U.S. Appl. No. 17/230,890.
Advisory Action notified Jan. 25, 2024 for U.S. Appl. No. 17/408,323.
Advisory Action notified Jan. 25, 2024 for U.S. Appl. No. 17/472,330.
Advisory Action notified Mar. 6, 2024 for U.S. Appl. No. 17/230,889.
Ex Parte Quayle Action notified Aug. 24, 2023 for U.S. Appl. No. 17/408,251.
Final Office Action notified Dec. 22, 2023 for U.S. Appl. No. 17/230,889.
Final Office Action notified Nov. 29, 2023 for U.S. Appl. No. 17/230,890.
Final Office Action notified Oct. 24, 2023 for U.S. Appl. No. 17/472,330.
Final Office Action notified Oct. 27, 2023 for U.S. Appl. No. 17/408,323.
First Office Action notified Jan. 9, 2024 for Taiwan Patent Application No. 112147200.
Non-Final Office Action notified Aug. 30, 2023 for U.S. Appl. No. 17/230,889.
Non-Final Office Action notified Dec. 15, 2023 for U.S. Appl. No. 17/229,743.
Non-Final Office Action notified Jul. 26, 2023 for U.S. Appl. No. 7/230,890.
Non-Final Office Action notified Jun. 5, 2024 for U.S. Appl. No. 18/450,985.
Non-Final Office Action Notified Mar. 27, 2024 for U.S. Appl. No. 17/230,890.
Non-Final Office Action notified Oct. 5, 2023 for U.S. Appl. No. 17/229,754.
Non-Final Office Action notified Sep. 6, 2023 for Taiwan Patent Application No. 112127062.
Non-Final Office Action notified Sep. 15, 2023 for U.S. Appl. No. 17/408,326.
Notice of Allowance notified Apr. 24, 2024 for U.S. Appl. No. 17/229,743.
Notice of Allowance notified Apr. 24, 2024 for U.S. Appl. No. 17/229,754.
Notice of Allowance notified Feb. 7, 2024 for U.S. Appl. No. 17/408,323.
Notice of Allowance notified Feb. 22, 2024 for U.S. Appl. No. 17/472,330.

(56) References Cited

OTHER PUBLICATIONS

Notice of Allowance notified Feb. 29, 2024 for U.S. Appl. No. 17/408,326.
Notice of Allowance notified Jan. 8, 2024 for Taiwan Patent Application No. 112127062.
Notice of Allowance notified Jul. 27, 2023 for U.S. Appl. No. 17/229,750.
Notice of Allowance notified Sep. 11, 2023 for Taiwan Patent Application No. 111129893.
Notice of Allowance notified Sep. 29, 2023 for U.S. Appl. No. 17/408,251.
Notice of Preliminary Rejection Non-Final notified Apr. 8, 2024 for Korean Patent Application No. 10-2021-7029807.
Office Action notified Jun. 11, 2024 for Taiwan Patent Application No. 113109865.
Oya et al., "A Majority-Logic Device Using an Irreversible Single-Electron Box," IEEE Transaction on Nanotechnology, vol. 2, No. I, Mar. 2003, pp. 15-22 (9 pages).

* cited by examiner

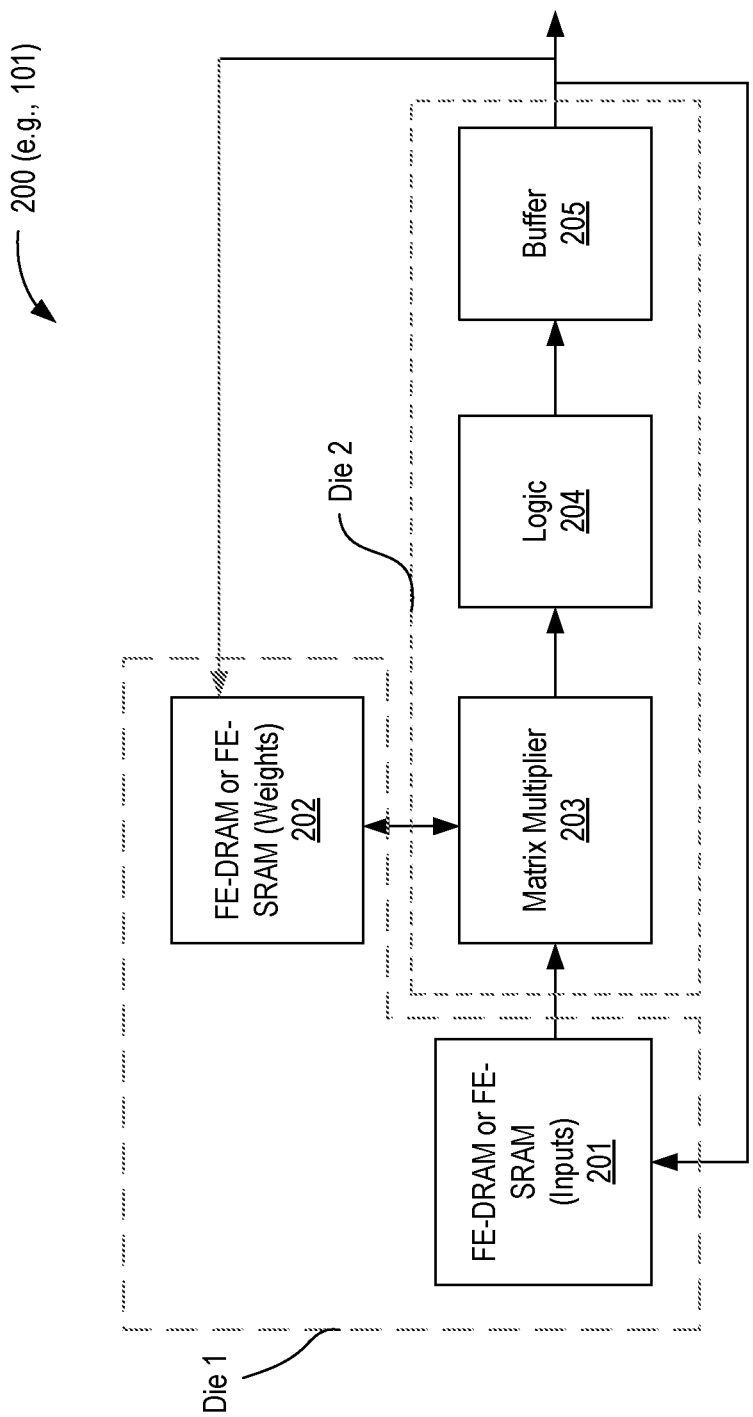

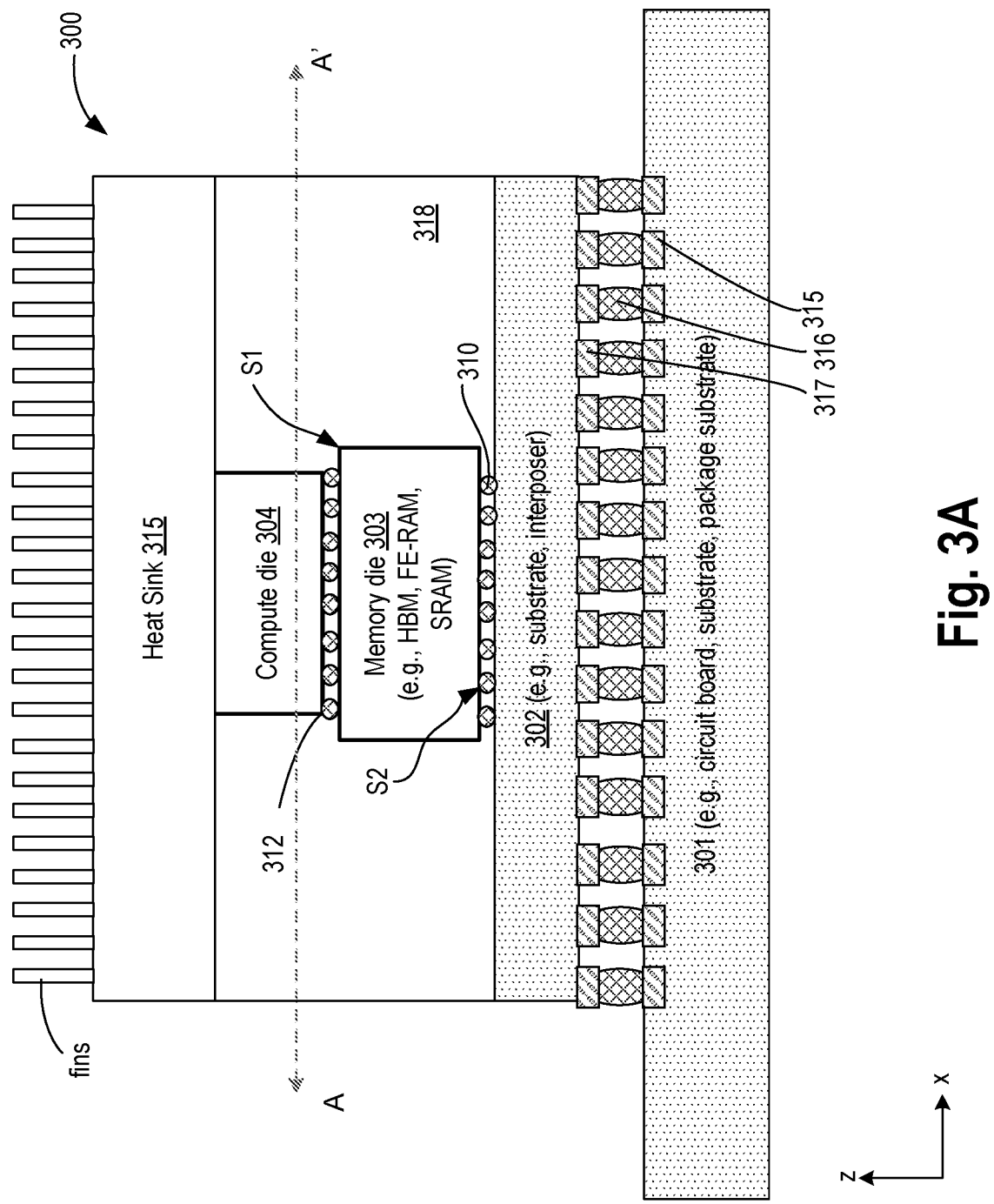

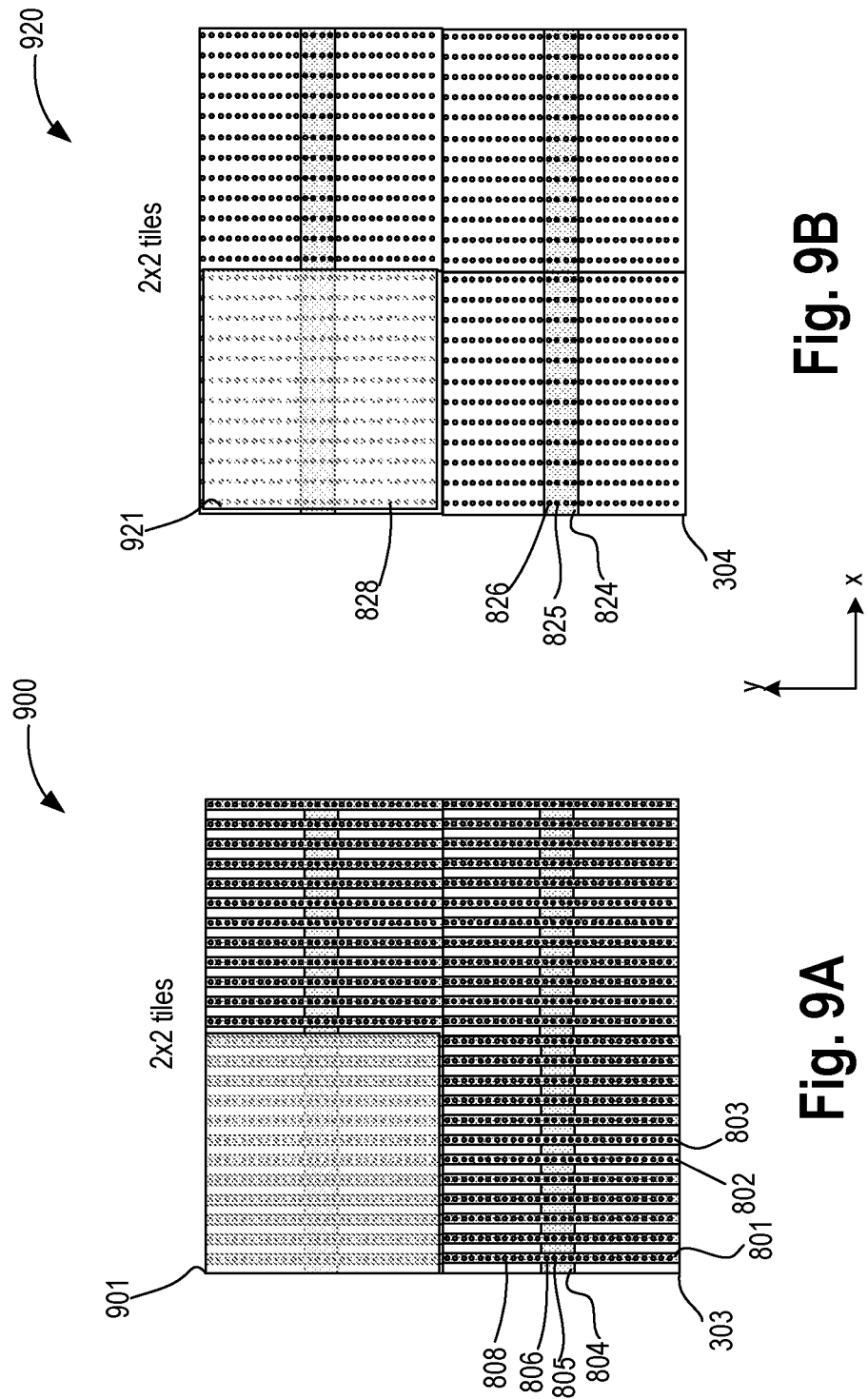

METHOD OF FORMING 3D STACKED COMPUTE AND MEMORY WITH COPPER PILLARS

CLAIM OF PRIORITY

This application is a continuation of and claims priority to, U.S. patent application Ser. No. 17/472,325, filed Sep. 10, 2021, and now issued as U.S. Pat. No. 11,764,190 on Sep. 19, 2023, and which is a continuation of, and claims priority to, U.S. patent application Ser. No. 16/357,265, filed Mar. 18, 2019 and now issued as U.S. Pat. No. 11,139,270 on Oct. 5, 2021, and titled, "ARTIFICIAL INTELLIGENCE PROCESSOR WITH THREE-DIMENSIONAL STACKED MEMORY," which are incorporated by reference in its entirety for all purposes.

BACKGROUND

Artificial intelligence (AI) is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained". This trained model with fixed weights is then used to make decisions about new data. Training a model and then applying the trained model for new data is hardware intensive activity. There is a desire to reduce latency of computing the training model and using the training model, and to reduce the power consumption of such AI processor systems.

The background description provided here is for the purpose of generally presenting the context of the disclosure. Unless otherwise indicated here, the material described in this section is not prior art to the claims in this application and is not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 illustrates an architecture of a computational block comprising a compute die positioned on top of a memory die, in accordance with some embodiments.

FIG. 3A illustrates a cross-section of a package comprising a computational block, which includes a compute die (e.g., an inference logic die) above a memory die, in accordance with some embodiments.

FIG. 9A illustrates a cross-section of a memory die with 2×2 tiles, which is below the compute die, in accordance with some embodiments.

FIG. 9B illustrates a cross-section of a compute die with 2×2 tiles, which is above the memory die, in accordance with some embodiments.

FIG. 10 illustrates a method of forming a package with

DETAILED DESCRIPTION

Figure 1:
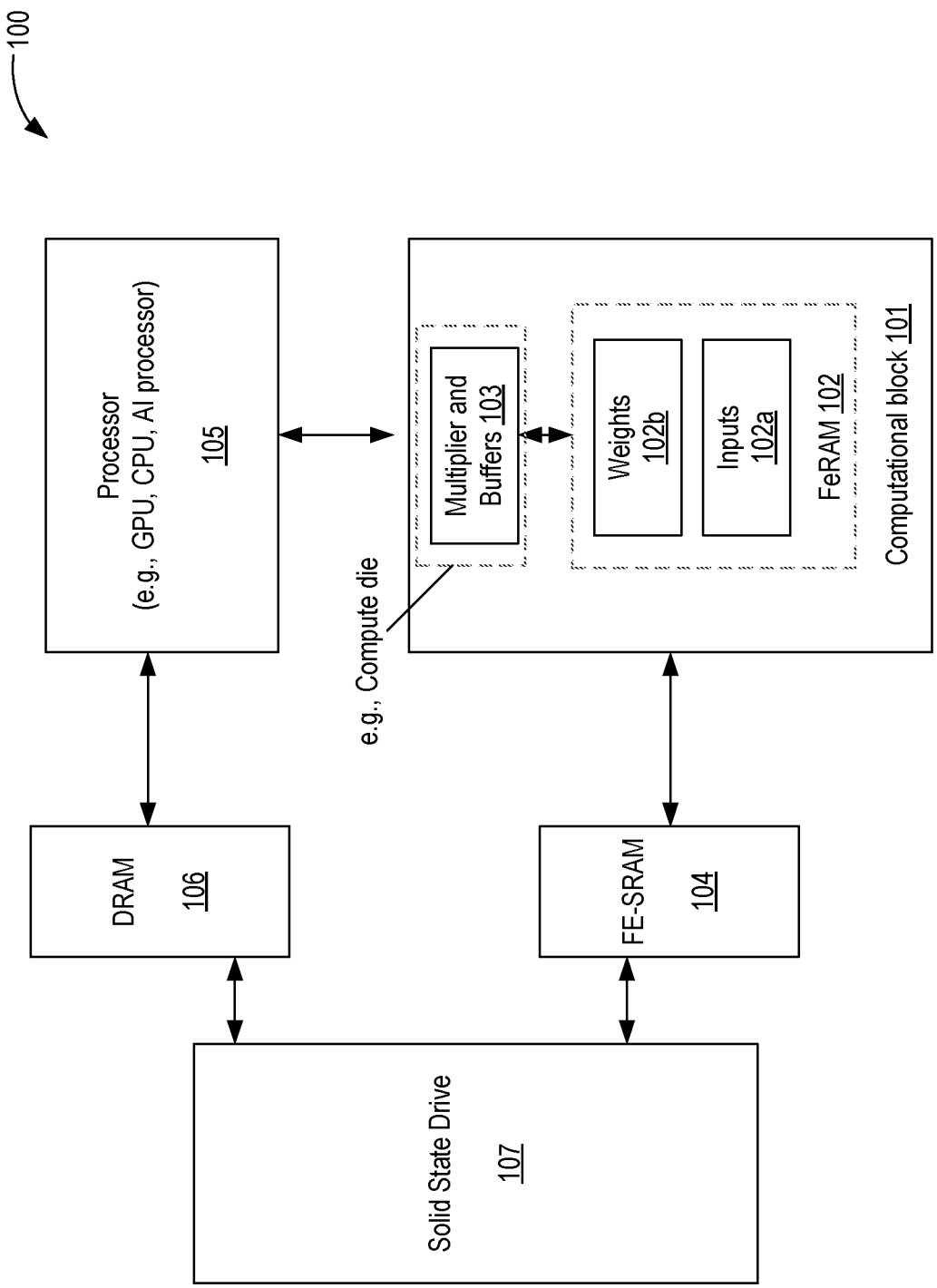
FIG. 1 illustrates a high-level architecture of an artificial intelligence (AI) machine comprising a compute die positioned on top of a memory die, in accordance with some embodiments.

Some embodiments describe a packaging technology to improve performance of an AI processing system. In some embodiments, an integrated circuit package is provided which comprises: a substrate; a first die on the substrate, and a second die stacked over the first die, wherein the first die comprises memory and the second die comprises computational logic. In some embodiments, the first die comprises a ferroelectric random access memory (FeRAM) having bit-cells, wherein each bit-cell comprises an access transistor and a capacitor including ferroelectric material, and wherein the access transistor is coupled to the ferroelectric material. The FeRAM can be FeDRAM (ferroelectric dynamic random access memory) or FeSRAM (ferroelectric static random access memory). The memory of the first die may store input data and weight factors. The computational logic of the second die is coupled to the memory of the first die. The second die can be an inference die that applies fixed weights for a trained model to an input data to generate an output. In some embodiments, the second die includes processing cores (or processing entities (PEs)) that have matrix multipliers, adders, buffers, etc. In some embodiments, first die comprises a high bandwidth memory (HBM). HBM may include a controller and memory arrays.

In some embodiments, the second die includes an application specific integrated circuit (ASIC) which can train the model by modifying the weights and also use the model on new data with fixed weights. In some embodiments, the memory comprises an SRAM (static random access memory). In some embodiments, the memory of the first die comprises MRAM (magnetic random access memory). In some embodiments, the memory of the first die comprises Re-RAM (resistive random access memory). In some embodiments, the substrate is an active interposer, and the first die is embedded in the active interposer. In some embodiments, the first die is an active interposer itself.

In some embodiments, the integrated circuit package is a package for a system-on-chip (SOC). The SOC may include a compute die on top of a memory die; an HBM, and a processor die coupled to memory dies adjacent to it (e.g., on top of or on the side of the processor die). In some embodiments, the SOC includes a solid-state memory die.

There are many technical effects of the packaging technology of various embodiments. For example, by placing the memory die below the compute die, or by placing one or more memory dies on the side(s) of the compute die, AI system performance improves. In some embodiments, by using Fe-RAMs for the memory, matrix multiplication process by the compute die is 15 to 20 times faster than traditional matrix multiplication. Further, using Fe-RAM reduces power consumption of the AI system by orders of magnitude compared to SRAM based memory. Using Fe-RAM also lowers the interconnect energy, lowers the external memory bandwidth requirement, reduces circuit complexity, and lowers the cost of the compute system. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up, respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal," and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis, or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a high-level architecture of an artificial intelligence (AI) machine 100 comprising a compute die positioned on top of a memory die, in accordance with some embodiments. AI machine 100 comprises computational block 101 or processor having random access memory (RAM) 102 and computational logic 103; static random access memory (SRAM) 104, main processor 105, dynamic random access memory (DRAM) 106, and solid-state memory or drive (SSD) 107. In some embodiments, some or all components of AI machine are packaged in a single package forming a system-on-chip (SOC). In some embodiments, computational block 101 is packaged in a single package and then coupled to processor 105 and memories 104, 106, and 107 on a printed circuit board (PCB). In various embodiments, computational block 101 comprises a special purpose compute die 103 or microprocessor. In some embodiments, RAM 102 is a ferroelectric RAM (Fe-RAM) which forms a special memory/cache for the special purpose compute die 103. In some embodiments, compute die 103 is specialized for applications such as Artificial Intelligence, graph processing, and algorithms for data processing. In some embodiments, compute die 103 further has logic computational blocks, for example, for multipliers and buffers, a special data memory block (e.g., buffers) comprising FE-RAM. In some embodiments, FE-RAM 102 has weights and inputs stored in-order to improve the computational efficiency. The interconnects between processor 105 or special purpose processor 105, FE-SRAM 104 and Compute die 103 are optimized for high bandwidth and low latency. The architecture of FIG. 1 allows efficient packaging to lower the energy/power/cost.

In some embodiments, RAM 102 comprises an SRAM which is partitioned to store input data (or data to be processed) 102a and weight factors 102b. In some embodiments, RAM 102 comprises Fe-RAM. For example, RAM 102 comprises FE-DRAM or FE-SRAM. In some embodiments, input data 103a is stored in a separate memory (e.g., a separate memory die) and weight factors 102b are stored in s a separate memory (e.g., separate memory die).

In some embodiments, computational logic 103 comprises matrix multiplier, adder, concatenation logic, buffers, and combinational logic. In various embodiments, computational logic 103 performs multiplication operation on inputs 102a and weights 102b. In some embodiments, weights 102b are fixed weights. For example, processor 105 (e.g., a graphics processor unit (GPU), an AI processor, a central processing unit (CPU), or any other high performance processor) computes the weights for a training model. Once the weights are computed, they are stored in memory 102b. In various embodiments, the input data that is to be analyzed using a trained model is processed by computational block 101 with computed weights 102b to generate an output (e.g., a classification result).

In some embodiments, SRAM 104 is ferroelectric based SRAM. For example, a six transistor (6T) SRAM bit-cells having ferroelectric transistors are used to implement a non-volatile Fe-SRAM. In some embodiments, SSD 107 comprises NAND flash cells. In some embodiments, SSD 107 comprises NOR flash cells. In some embodiments, SSD 107 comprises multi-threshold NAND flash cells.

In various embodiments, the non-volatility of Fe-RAM is used to introduce new features such as security, functional safety, and faster reboot time of architecture 100. The non-volatile Fe-RAM is a low power RAM that provides fast access to data and weights. Fe-RAM 104 can also serve as a fast storage for inference die 101 (or accelerator), which typically has low capacity and fast access requirements.

In various embodiments, the Fe-RAM (Fe-DRAM or Fe-SRAM) includes ferroelectric material. The ferroelectric (FE) material may be in a transistor gate stack or in a capacitor of the memory. The ferroelectric material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, perovskite can be doped (e.g., by La or lanthanides). In various embodiments, when the FE material is a perovskite, the conductive oxides are of the type AA'BB'$O_3$. A' is a dopant for atomic site A, it can be an element from the lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material.

FIG. 2 illustrates an architecture of a computational block 200 (e.g., 101) comprising a compute die positioned on top of a memory die, in accordance with some embodiments. The architecture of FIG. 2 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, memory die is a high bandwidth memory (HBM) which comprises multiple dies of memories in a stack and a controller to control the read and write functions to the stack of memory dies. In some embodiments, memory die comprises a first die 201 to store input data and a second die 202 to store weight factors. In some embodiments, memory die is a single die that is partitioned such that first partition 201 of the memory die is used to store input data and second partition 202 of the memory die is used to store weights. In some embodiments, the memory die comprises FE-DRAM. In some embodiments, the memory die comprises FE-SRAM. In some embodiments, the memory die comprises MRAM. In some embodiments, the memory die comprises SRAM. For example, memory partitions 201 and 202, or memory dies 201 and 202 include one or more of: FE-SRAM, FE-DRAM, SRAM, and/or MRAM. In some embodiments, the input data stored in memory partition or die 201 is the data to be analyzed by a trained model with fixed weights stored in memory partition or die 202.

In some embodiments, compute die comprises matrix multiplier 203, logic 204, and temporary buffer 205. Matrix multiplier 203 performs multiplication operation on input data 'X' and weights 'W' to generate an output 'Y'. This output may be further processed by logic 204. In some embodiments, logic 204 performs: a threshold operation, pooling and drop out operations, and/or concatenation operations to complete the AI logic primitive functions. In some embodiments, the output of logic 204 (e.g., processed output 'Y') is temporarily stored in buffer 205. In some embodiments, buffer 205 is memory such as one or more of: Fe-SRAM, Fe-DRAM, MRAM, resistive RAM (Re-RAM) and/or SRAM. In some embodiments, buffer 205 is part of the memory die (e.g., Die 1). In some embodiments, buffer 205 performs the function of a re-timer. In some embodiments, the output of buffer 205 (e.g., processed output 'Y') is used to modify the weights in memory partition or die 202. In one such embodiment, computational block 200 not only operates as an inference circuitry, but also as a training circuitry to train a model. In some embodiments, matrix multiplier 203 includes an array of multiplier cells, wherein the FeRAMs 201 and 202 include arrays of memory bit-cells, respectively, wherein each multiplier cell is coupled to a corresponding memory bit-cell of the FE-RAM 201 and/or FE-RAM 202. In some embodiments, computational block 200 comprises an interconnect fiber coupled to the array of multiplier cells such that each multiplier cell is coupled to the interconnect fiber.

Architecture 200 provides reduced memory access for compute die (e.g., Die 2) by providing data locality for weights, inputs and outputs. In one example, data from and to the AI computational blocks (e.g., matrix multiplier 203) is locally processed within a same packaging unit. Architecture 200 also segregates the memory and logic operations on to a memory die (e.g., Die 1) and a logic die (e.g., Die 2), respectively, allowing for optimized AI processing. Desegregated dies allow for improved yield of the dies. A high capacity memory process for Die 1 allows reduction of power of the external interconnects to memory, reduces cost of integration, and also results in a smaller foot-print.

FIG. 3A illustrates a cross-section of a package 300 comprising a computational block, which includes a compute die (e.g., an inference logic die) above a memory die, in accordance with some embodiments.

In some embodiments, integrated circuity (IC) package assembly is coupled to circuity board 301. In some embodiments, circuit board 301 may be a Printed Circuit Board (PCB) composed of an electrically insulative material such as an epoxy laminate. For example, circuit board 301 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material. In some embodiments, layer 301 is a package substrate and is part of the IC package assembly.

The IC package assembly may include substrate 302, memory die 303 (e.g., Die 1 of FIG. 2), compute die 304 (e.g., Die 2 of FIG. 2). In various embodiments, memory die 303 is below compute die 304. This particular topology enhances the overall performance of the AI system. In various embodiments, compute die 304 comprises logic portions of an inference die. An inference die or chip is used to apply inputs and fixed weights associated with a trained model to generate an output. By separating the memory 303 associated with inference die 304, the AI performance increases. Further, such topology allows for better use of thermal solutions such as heat sink 315, which radiates heat away from the power consuming source, inference die 304. In various embodiments, memory 303 can be one or more of: FE-SRAM, FE-DRAM, SRAM, MRAM, resistance RAM (Re-RAM), or a combination of them. Using FE-SRAM, MRAM, or Re-RAM allows for low power and high-speed memory operation. This allows for placing memory die 303 below compute die 304 to use the thermal solution more efficiently for compute die 304. In some embodiments, memory die 303 is a high bandwidth memory (HBM).

In some embodiments, compute die 304 is an application specific circuit (AMC), a processor, or some combination of such functions. In some embodiments, one or both of memory die 303 and compute die 304 may be embedded in encapsulant 318. In some embodiments, encapsulant 318 can be any suitable material, such as epoxy-based build-up substrate, other dielectric/organic materials, resins, epoxies, polymer adhesives, silicones, acrylics, polyimides, cyanate esters, thermoplastics, and/or thermosets.

In some embodiments, memory die 303 may have a first side S1 and a second side S2 opposite to the first side S1. In some embodiments, first side S1 may be the side of the die commonly referred to as the "inactive" or "back" side of the die. In some embodiments, the backside of memory die 303 may include active or passive devices, signal and power routings, etc. In some embodiments, second side S2 may include one or more transistors (e.g., access transistors), and may be the side of the die commonly referred to as the "active" or "front" side of the die. The memory circuitry of some embodiments can have active and passive devices in the front side of the die too. In some embodiments, second side S2 of memory die 303 may include one or more electrical routing features 310. In some embodiments, compute die 304 may include an "active" or "front" side with one or more electrical routing features 312. In some embodiments, electrical routing features 312 may be bond pads, micro bumps, solder balls, or any other suitable coupling technology.

In some embodiments, memory die 302 may include one or more through-silicon vias (TSVs) that couple substrate 302 to compute die 304 via electrical routing features 312. For example, compute die 304 is coupled to memory die 303 by die interconnects. In some embodiments, inter-die interconnects may be soldering bumps, copper pillars, or other electrically conductive features. In some embodiments, an interface layer (not shown) may be provided between memory die 303 and compute die 304. Memory die 303 may couple to compute die 304 using TSVs. In some embodiments, interconnect pillars with corresponding solder balls are used to connect memory die 303 with compute die 304. In some embodiments, the interface layer (not shown) may be, or may include, a layer of under-fill, adhesive, dielectric, or other material. In some embodiments, the interface layer may serve various functions, such as providing mechanical strength, conductivity, heat dissipation, or adhesion.

In some embodiments, package substrate 301 may be a careless substrate. For example, package substrate 301 may be a "bumpless" build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate, but can be used for any suitable flip chip substrates. In some embodiments, the one or more build-up layers may have material properties that may be altered and/or optimized for reliability, warpage reduction, etc. In some embodiments, package substrate 504 may be composed of a polymer, ceramic, glass, or semiconductor material. In some embodiments, package substrate 302 may be a conventional cored substrate and/or an interposer. In some embodiments, package substrate 302 includes active and/or passive devices embedded therein.

In some embodiments, the upper side of package substrate 302 is coupled to second surface S2 and/or electrical routing features 310 of memory die 303. In some embodiments, a lower opposite side of package substrate 302 is coupled to circuit board 301 by package interconnects 317. In some embodiments, package interconnects 316 may couple electrical routing features 317 disposed on the second side of package substrate 504 to corresponding electrical routing features 315 on circuit board 301.

In some embodiments, package substrate 504 may have electrical routing features formed therein to route electrical signals between memory die 303 (and/or compute die 304) and circuit board 301 and/or other electrical components external to the IC package assembly. In some embodiments, package interconnects 316 and die interconnects 310 include any of a wide variety of suitable structures and/or materials including, for example, bumps, pillars or balls formed using metals, alloys, solderable material, or their combinations. In some embodiments, electrical routing features 315 may be arranged in a ball grid array ("BGA") or other configuration.

In some embodiments, compute die 304 is coupled to memory die 303 in a front-to-back configuration (e.g., the "front" or "active" side of compute die 304 is coupled to the "back" or "inactive" side S1 of memory die 303). In some embodiments, dies may be coupled with one another in a front-to-front, back-to-back, or side-to-side arrangement. In some embodiments, one or more additional dies may be coupled with memory die 303, compute die 304, and/or with package substrate 302. In some embodiments, the IC package assembly may include, for example, combinations of flip-chip and wire-bonding techniques, interposers, multi-chip package configurations including system-on-chip (SoC) and/or package-on-package (PoP) configurations to route electrical signals.

In some embodiments, memory die 303 and compute die 304 may be single dies. In some embodiments, memory die 303 is a HBM that includes two or more dies, wherein the two or more dies include a controller die and memory die(s). In some embodiments, compute die may include two more dies. For example, buffer 205 may be a separate memory die coupled closer to surface S1 of memory die 303 and matrix multiplication and other computational units may be in a separate die. In one example, memory die 303 and/or compute die 304 may be a wafer (or portion of a wafer) having two or more dies formed on it. In some embodiments, memory die 303 and/or compute die 304 includes two or more dies embedded in encapsulant 318. In some embodiments, the two or more dies are arranged side-by-side, vertically stacked, or positioned in any other suitable arrangement.

In various embodiments, a heat sink 315 and associated fins are coupled to compute die 304. While heat sink 315 is shown as a thermal solution, other thermal solutions may also be used. For example, fan, liquid cooling, etc., may be used in addition to or instead of heat sink 315.

Figure 3B:
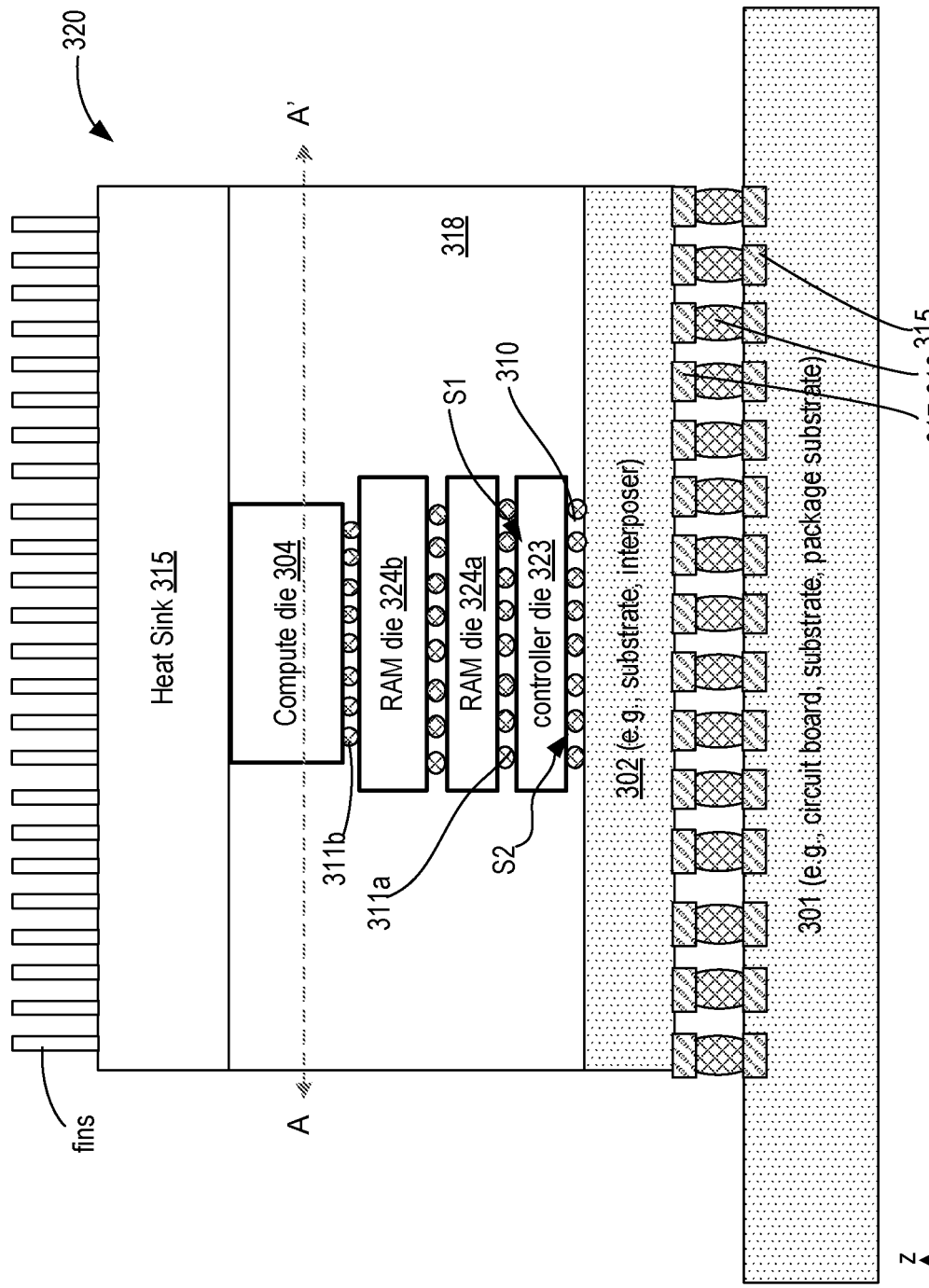
FIG. 3B illustrates a cross-section of a package comprising a computational block, which includes a compute die (e.g., an inference logic die) above a stack of memory dies and a controller logic die, in accordance with some embodiments.

FIG. 3B illustrates a cross-section of a package 320 comprising a computational block, which includes a compute die (e.g., an inference logic die) above a stack of memory dies and a controller logic die, in accordance with some embodiments. So as not to obscure the embodiment of FIG. 3B, differences between packages 300 and 320 are discussed. Here, memory die 303 is replaced with a controller die 323 and a stack of memory dies (RAMs) 324b and 324b. In some embodiments, controller die 323 is a memory controller, which includes read logic, write logic, column and row multiplexers, error correction logic, interface with RAMs 324a/b, interface with compute die 304, and interface with substrate 302. In various embodiments, memory dies 324a/b are placed or stacked above controller die 323. In some embodiments, RAMs 324a/b are one or more of: FE-SRAM, FE-DRAM, SRAM, MRAM, Re-RAM or a combination of them. In some embodiments, RAM die 324a is used to store inputs while RAM die 324b is used to store the weights. In some embodiments, any of the RAM dies 324a/b can also include memory for buffer 205. While the embodiment of FIG. 3B illustrates two RAM dies, any number of RAM dies can be stacked over controller die 323.

Figure 3C:
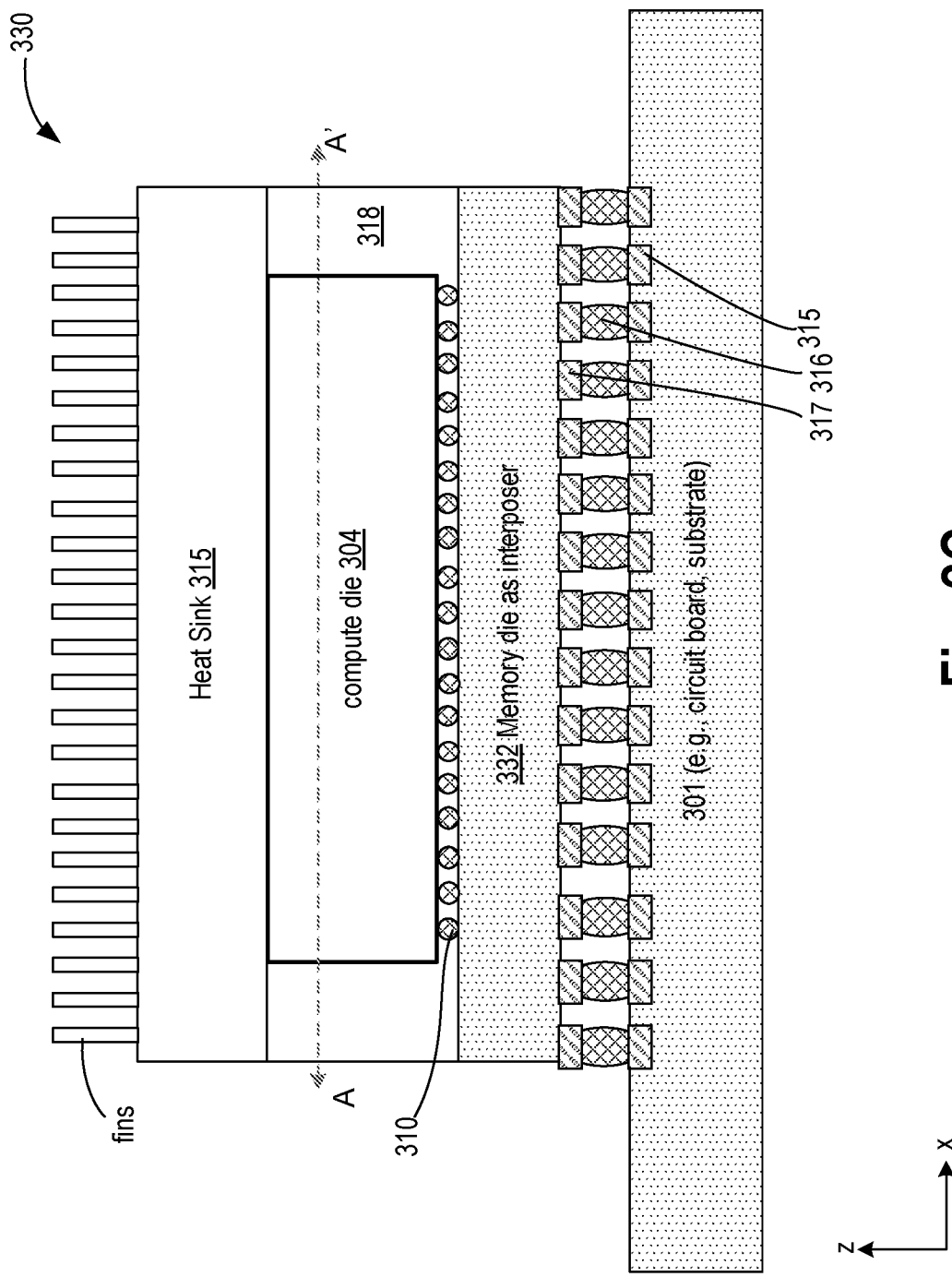
FIG. 3C illustrates a cross-section of a package comprising a computational block, which includes a compute die over a memory that also functions as an interposer, in accordance with some embodiments.

FIG. 3C illustrates a cross-section of a package 330 comprising a computational block, which includes compute die 304 over a memory that also functions as an interposer, in accordance with some embodiments. Compared to package 300, here memory die 303 is removed and integrated in interposer 332 such that the memory provides storage function as well as a function of an interposer. This configuration allows for reducing package cost. Interconnections 310 now electrically couple compute die 304 to memory 332. Memory 332 may comprise FE-SRAM, FE-DRAM, SRAM, MRAM, Re-RAM, or a combination of them.

Figure 3D:
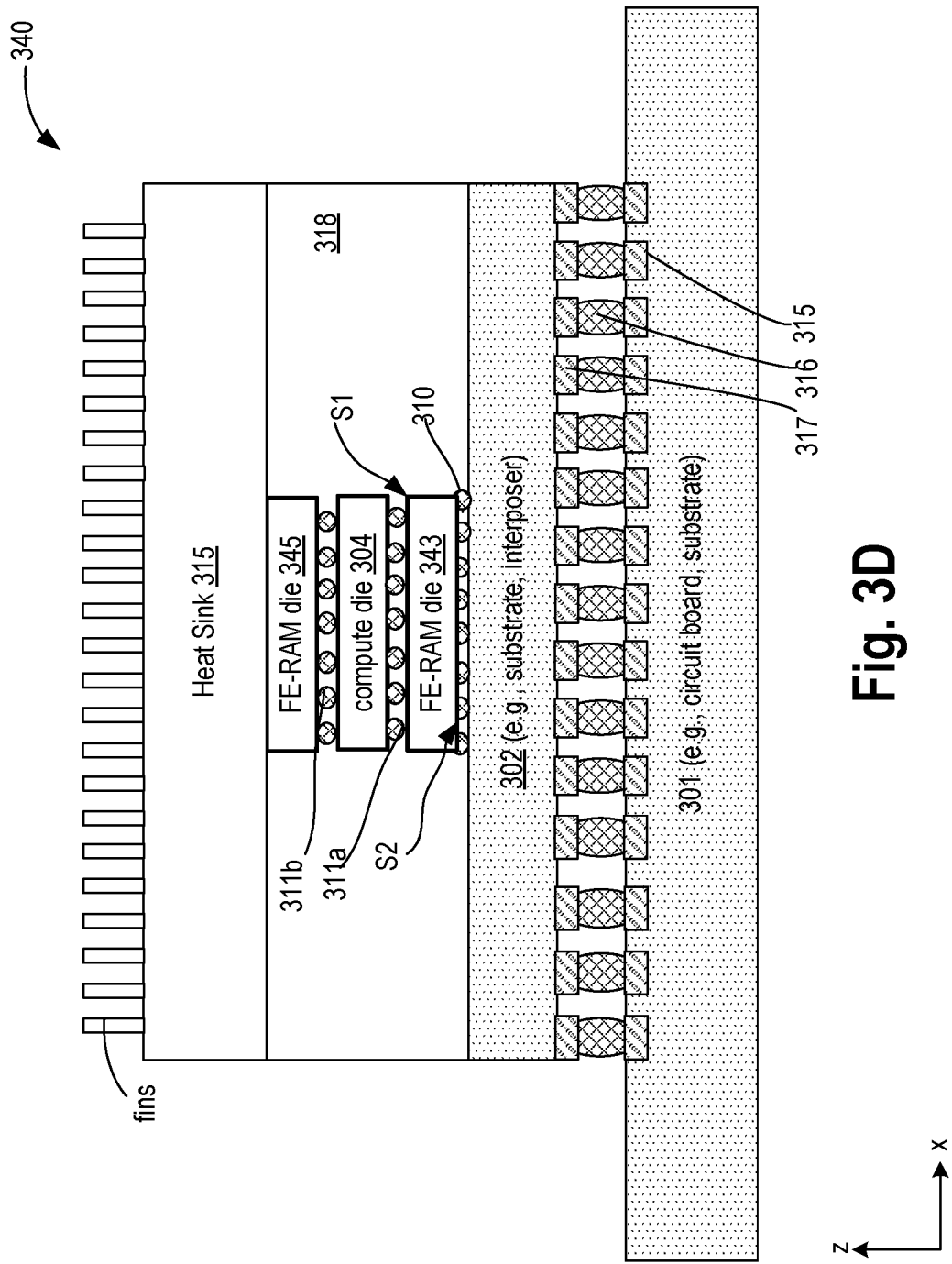
FIG. 3D illustrates a cross-section of a package comprising a computational block, which includes a compute die between memory dies in a horizontal stack along the plane of the package, in accordance with some embodiments.

FIG. 3D illustrates a cross-section of a package 340 comprising a computational block, which includes a compute die between memory dies in a horizontal stack along the plane of the package, in accordance with some embodiments. Compared to package 300, here compute die 304 is positioned between memories 343 and 345 such that RAM die 343 is coupled to substrate 302 via interconnections 310. In various embodiments, compute die 304 communicates with RAM dies 343 and 345 through both its front-side and back-side via interconnections 311a and 311b, respectively. This embodiment allows compute die 304 to efficiently use its real estate by applying active devices on its frontend and backend. RAM dies 343/345 may comprise FE-SRAM, FE-DRAM, SRAM, MRAM, Re-RAM, or a combination of them. In some embodiments, RAM die 343 is used to store inputs while RAM die 345 is used to store the weights. In some embodiments, any of the RAM dies 343 or 345 can also include memory for buffer 205. While the embodiment of FIG. 3D illustrates two RAM dies, any number of RAM dies can be stacked over and below compute die 304.

Figure 3E:
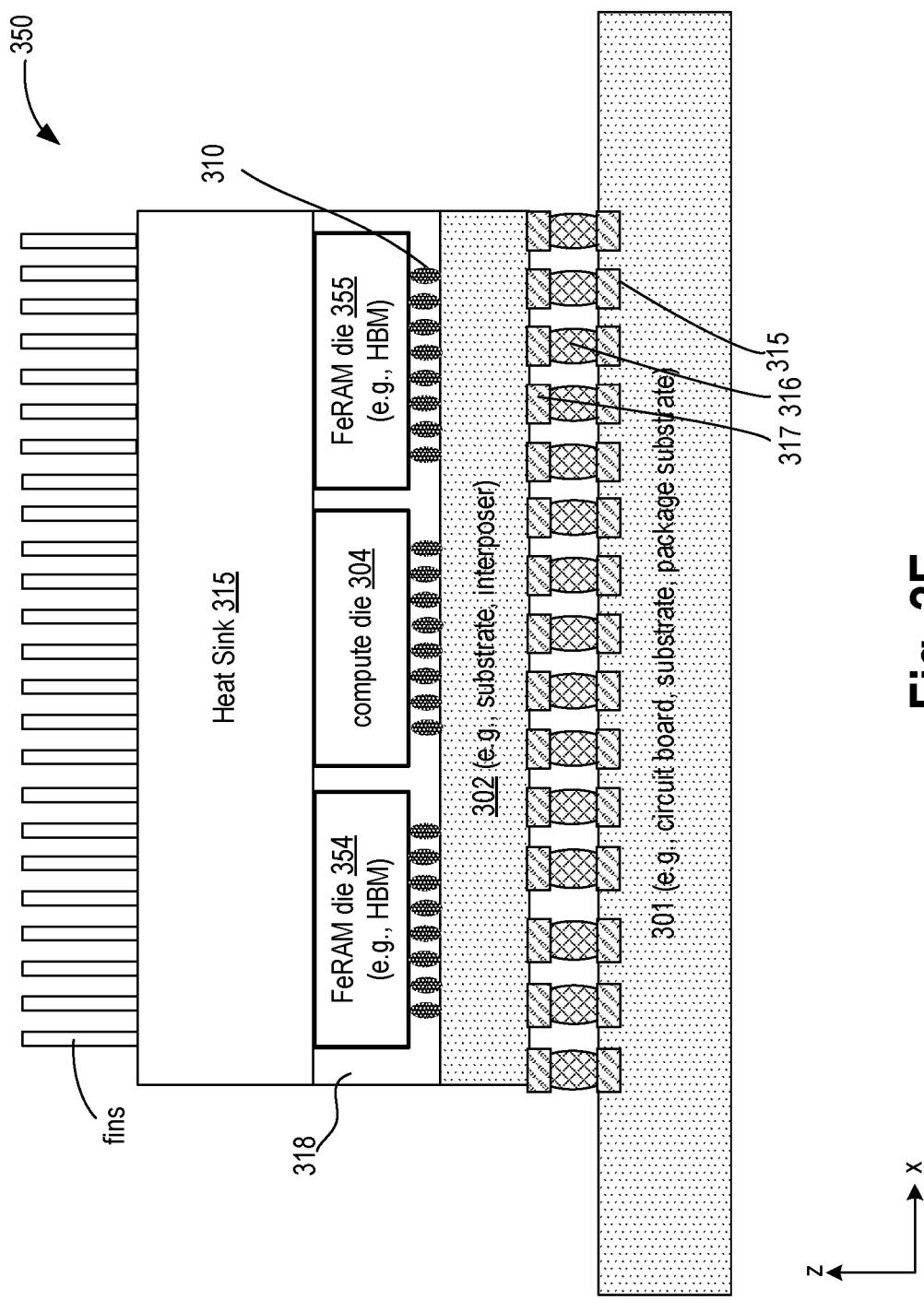
FIG. 3E illustrates a cross-section of a package comprising a computational block, which includes a compute die and two or more memories along a plane of the package, in accordance with some embodiments.

FIG. 3E illustrates a cross-section of a package 350 comprising a computational block, which includes a compute die and two or more memories along a plane of the package, in accordance with some embodiments. Compared to package 300, here compute die 304 is in the middle and memory dies 354 and 355 are on either side of compute die 304. In some embodiments, memory dies surround compute die 304. AI processing is memory intensive. Such an embodiment allows compute die 304 to access memory from its four sides. Heat sink 315 in this case is coupled to the memory dies 354 and 355 and compute die 304. RAM dies 354 and 355 may comprise FE-SRAM, FE-DRAM, SRAM, MRAM, Re-RAM, or a combination of them. RAM dies 354 and 355 may include HBM. Each HBM comprises two or more memory dies and a controller. In some embodiments, RAM die 354 is used to store inputs while RAM die 355 is used to store the weights. In some embodiments, any of the RAM dies 354 or 355 can also include memory for buffer 205. While the embodiment of FIG. 3E illustrates two RAM dies, any number of RAM dies can be positioned along the sides of compute die 304.

Figure 3F:
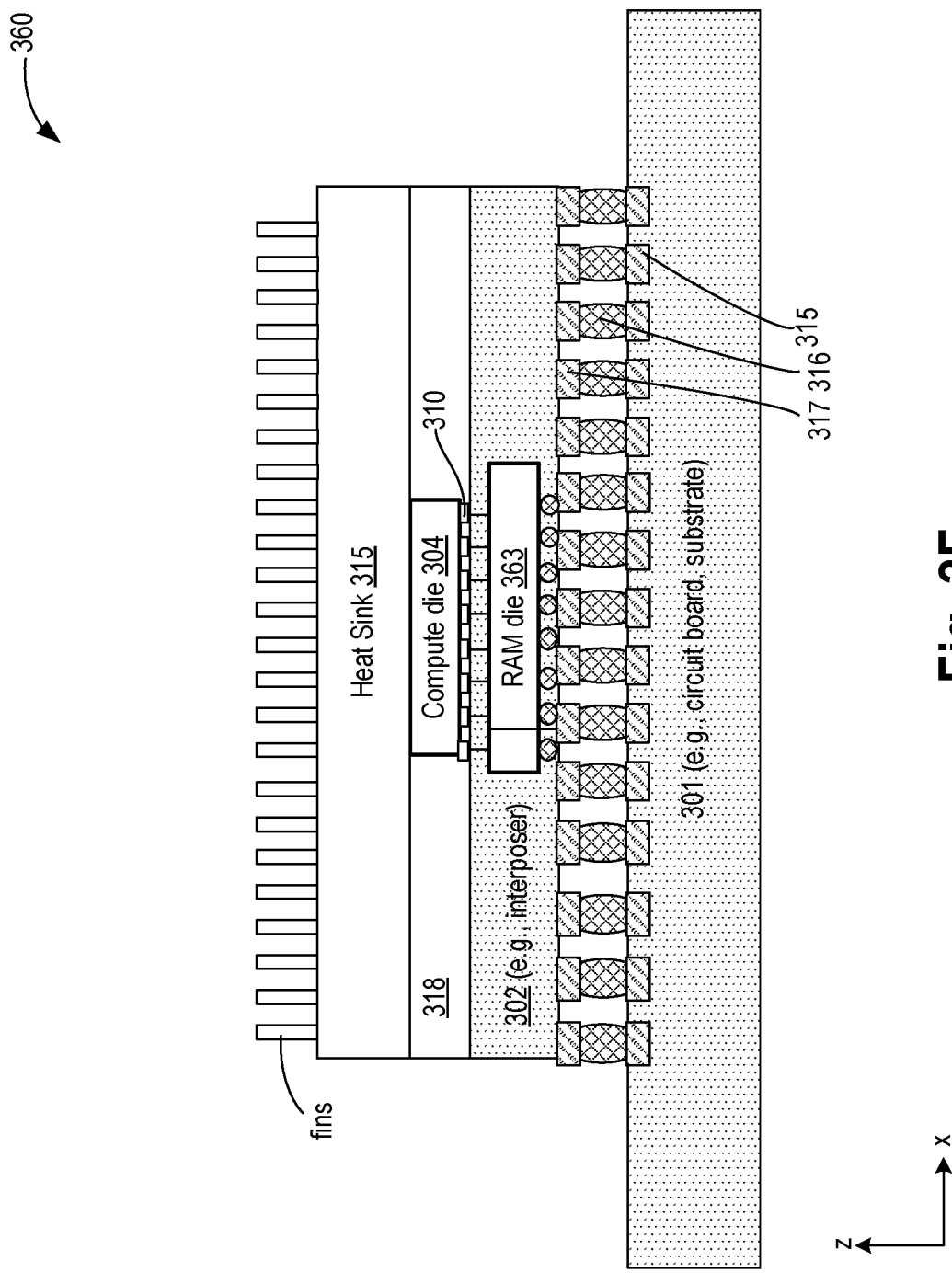
FIG. 3F illustrates a cross-section of a package comprising a computational block, which includes a compute die over an interposer, wherein the interposer comprises a memory die embedded in it, in accordance with some embodiments.

FIG. 3F illustrates a cross-section of a package 360 comprising a computational block, which includes a compute die over an interposer, wherein the interposer comprises a memory die embedded in it, in accordance with some embodiments. Compared to package 300, here memory die 363 is embedded in substrate or interposer 302. This embodiment allows for reducing the z-height of the package and also reduces the latency of singles two and from compute die 304 to other devices couples to substrate 301. RAM die 363 may comprise FE-SRAM, FE-DRAM, SRAM, MRAM, Re-RAM, or a combination of them. RAM die 363 may include HBM. Each HBM comprises two or more memory dies and a controller. While the embodiment of FIG. 3F illustrates one RAM die 363, any number of RAM dies can be embedded in interposer 302.

Figure 3G:
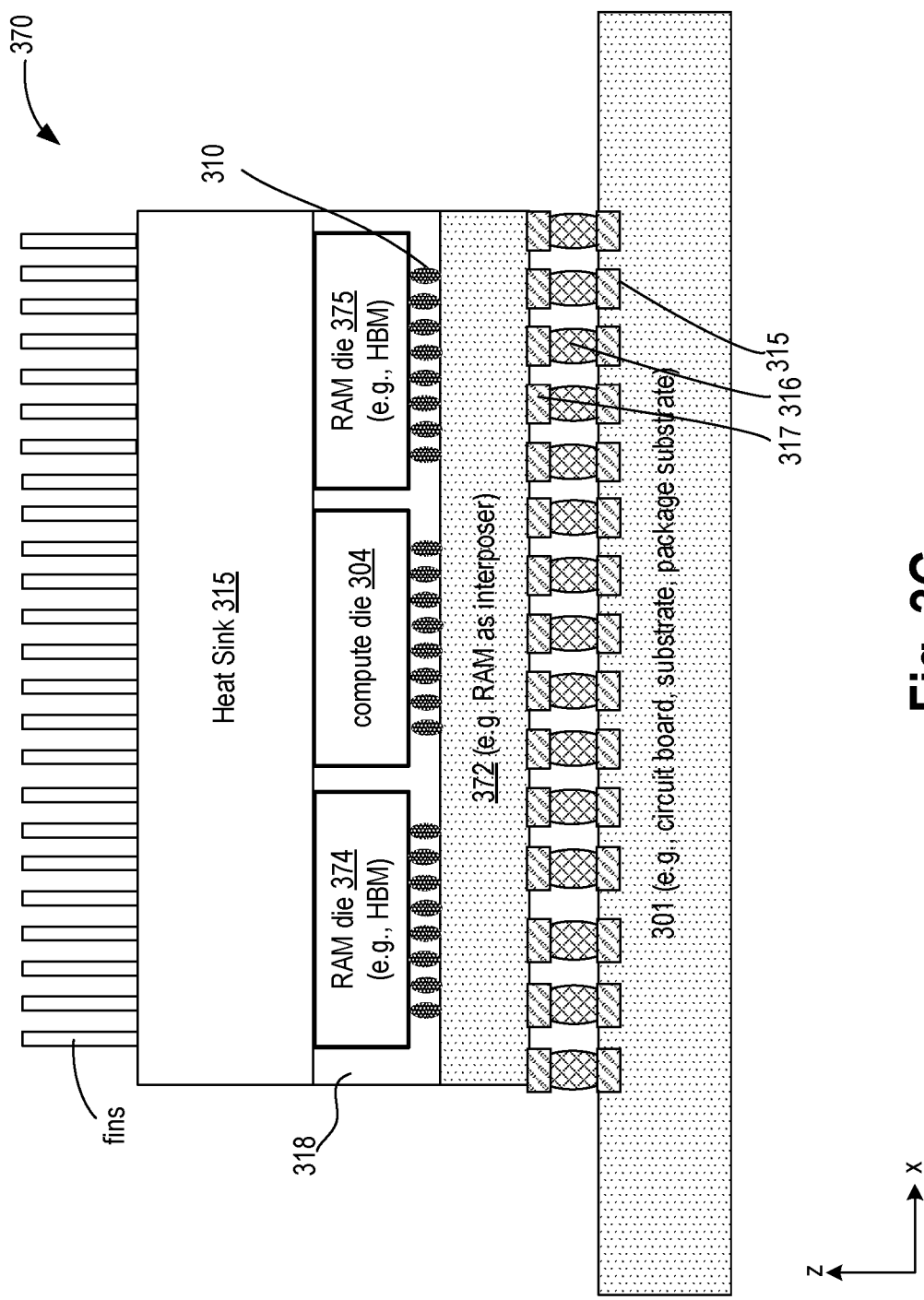
FIG. 3G illustrates a cross-section of a package comprising a computational block, which includes a compute die and two or more memories along a plane of the package, and a memory that also functions as an interposer, in accordance with some embodiments.

FIG. 3G illustrates a cross-section of a package 370 comprising a computational block, which includes a compute die and two or more memories along a plane of the package, and a memory that also functions as an interposer, in accordance with some embodiments. Compared to package 350, here memory 374 and 375 on the sides of compute die are RAMs (e.g., SRAM, Fe-RAM, MRAM, or Re-RAM). In various embodiments, interposer 302 is replaced with a memory that behaves as an interposer. The memory can be one of: FE-RAM, MRAM, Re-RAM, or SRAM. In some embodiments, the memory in the interposer is a three-dimensional (3D) Fe-RAM stack that also functions as an interposer. In some embodiments, the 3D memory stack is a stack of MRAMs, Re-RAMs, or SRAMs.

Figure 3H:
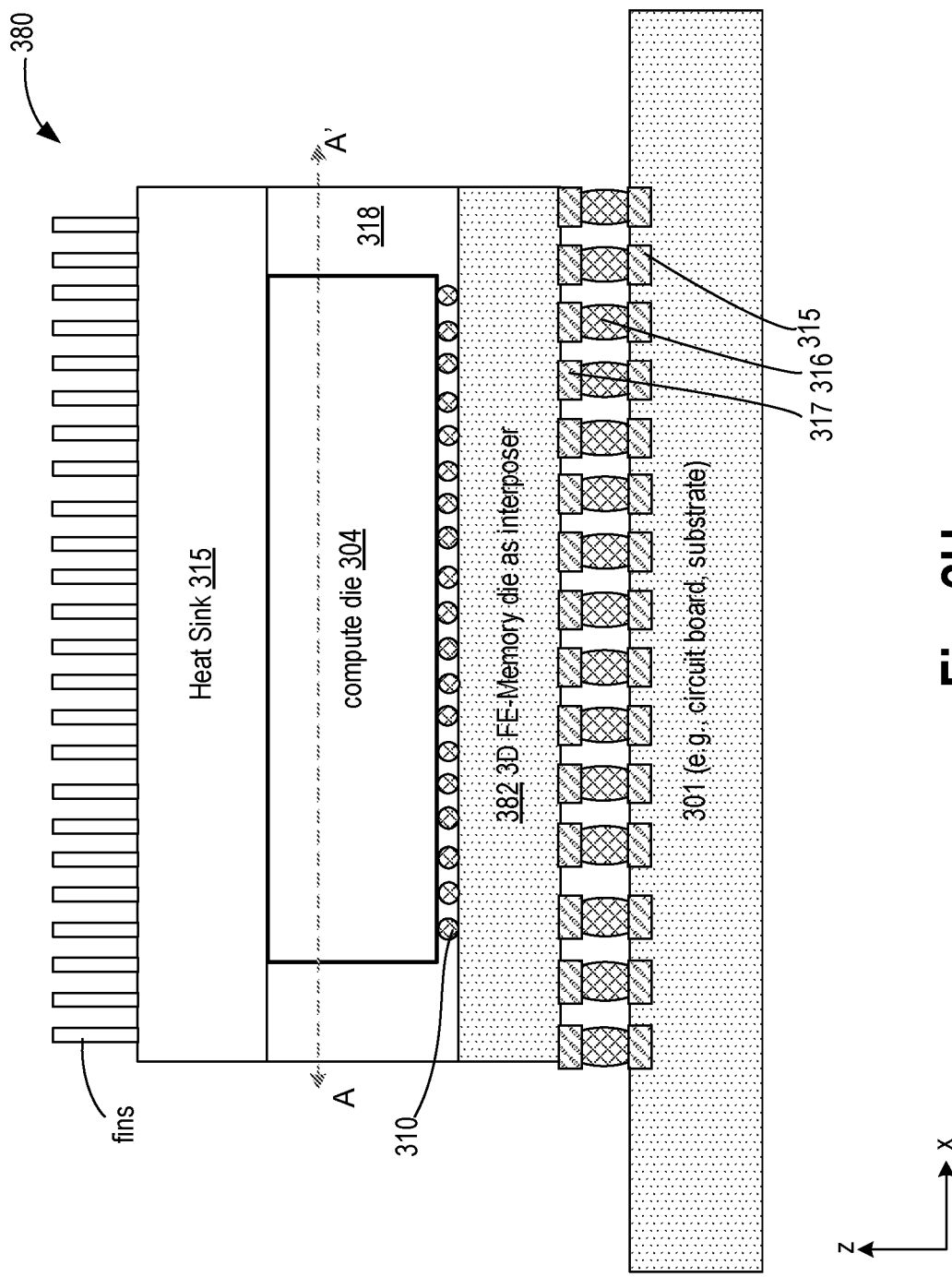
FIG. 3H illustrates a cross-section of a package comprising a computational block, which includes a compute die over a 3D ferroelectric memory that also functions as an interposer, in accordance with some embodiments.

FIG. 3H illustrates a cross-section of a package 380 comprising a computational block, which includes a compute die over a 3D ferroelectric memory that also functions as an interposer, in accordance with some embodiments. Compared to package 330, in various embodiments, memory interposer 332 is replaced with a three-dimensional (3D) Fe-RAM stack that also functions as an interposer. In some embodiments, the 3D memory stack is a stack of MRAMs, Re-RAMs, or SRAMs.

Figure 4A:
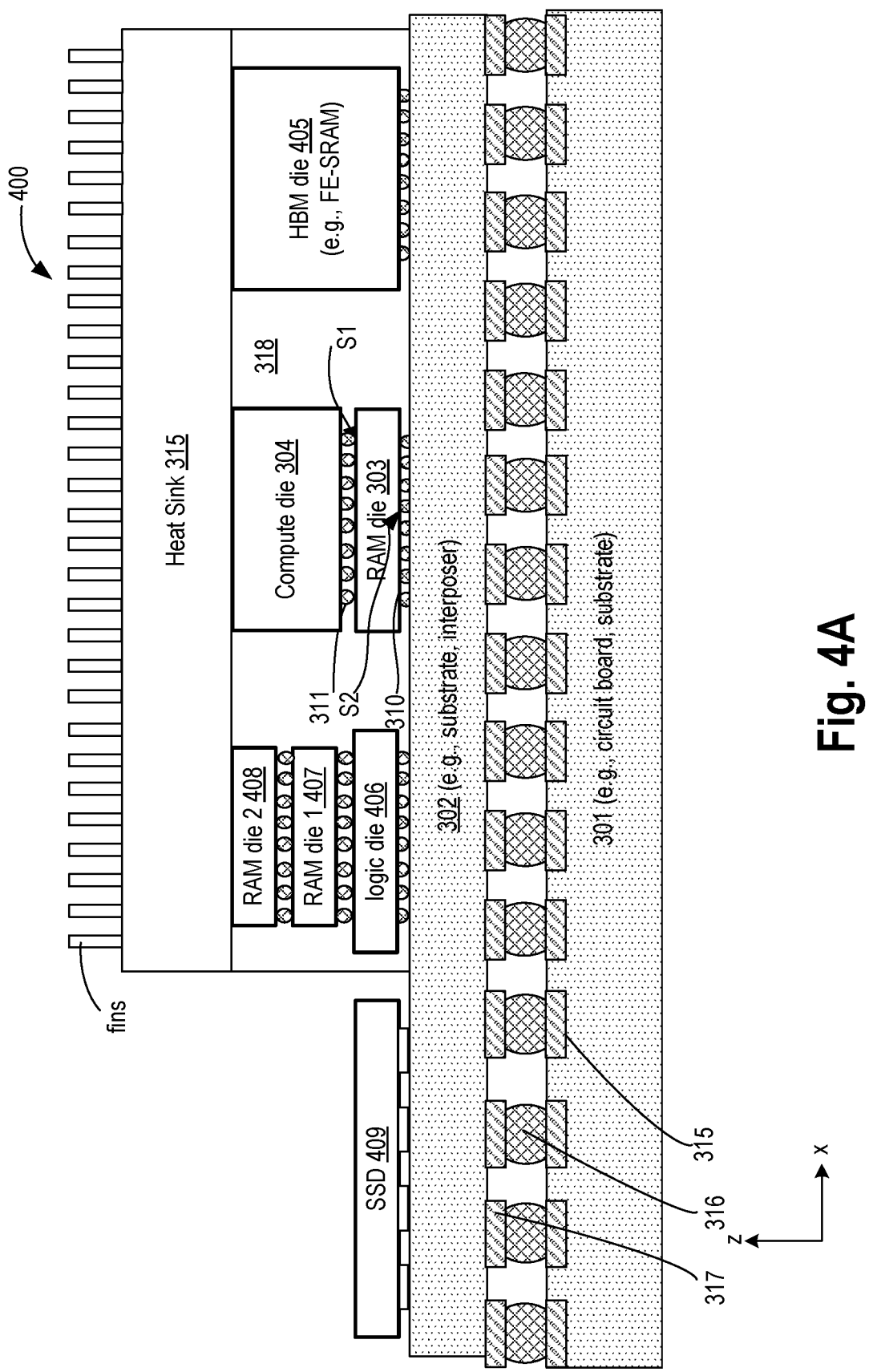
FIG. 4A illustrates a cross-section of package comprising an AI machine, which includes a system-on-chip (SOC) having a computational block, which includes a compute die over a memory, in accordance with some embodiments.

FIG. 4A illustrates a cross-section of package 400 comprising an AI machine, which includes a system-on-chip (SOC) having a computational block, which includes a compute die over a memory, in accordance with some embodiments. Package 400 comprises processor die 406 coupled to substrate or interposer 302. Two or more memory dies 407 (e.g., memory 104) and 408 (e.g., memory 106) are stacked on processor die 406. Processor die 406 (e.g., 105) can be any one of: central processing unit (CPU), graphics processor unit (GPU), application specific integrated circuit (ASIC). Memory (RAM) dies 407 and 408 may comprise FE-SRAM, FE-DRAM, SRAM, MRAM, Re-RAM, or a combination of them. In some embodiments, RAM dies 407 and 408 may include HBM. In some embodiments, one of memories 104 and 106 is implemented as HBM in die 405. The memories in HBM die 405 include any one or more of: FE-SRAM, FE-DRAM, SRAM, MRAM, Re-RAM, or a combination of them. Heat sink 315 provides a thermal management solution to the various dies in encapsulant 318. In some embodiments, solid-state drive (SSD) 409 is positioned outside of first package assembly that includes heat sink 315. In some embodiments, SSD 409 includes one of NAND flash memory, NOR flash memory, or any other type of non-volatile memory such as MRAM, FE-DRAM FE-SRAM, Re-RAM, etc.

Figure 4B:
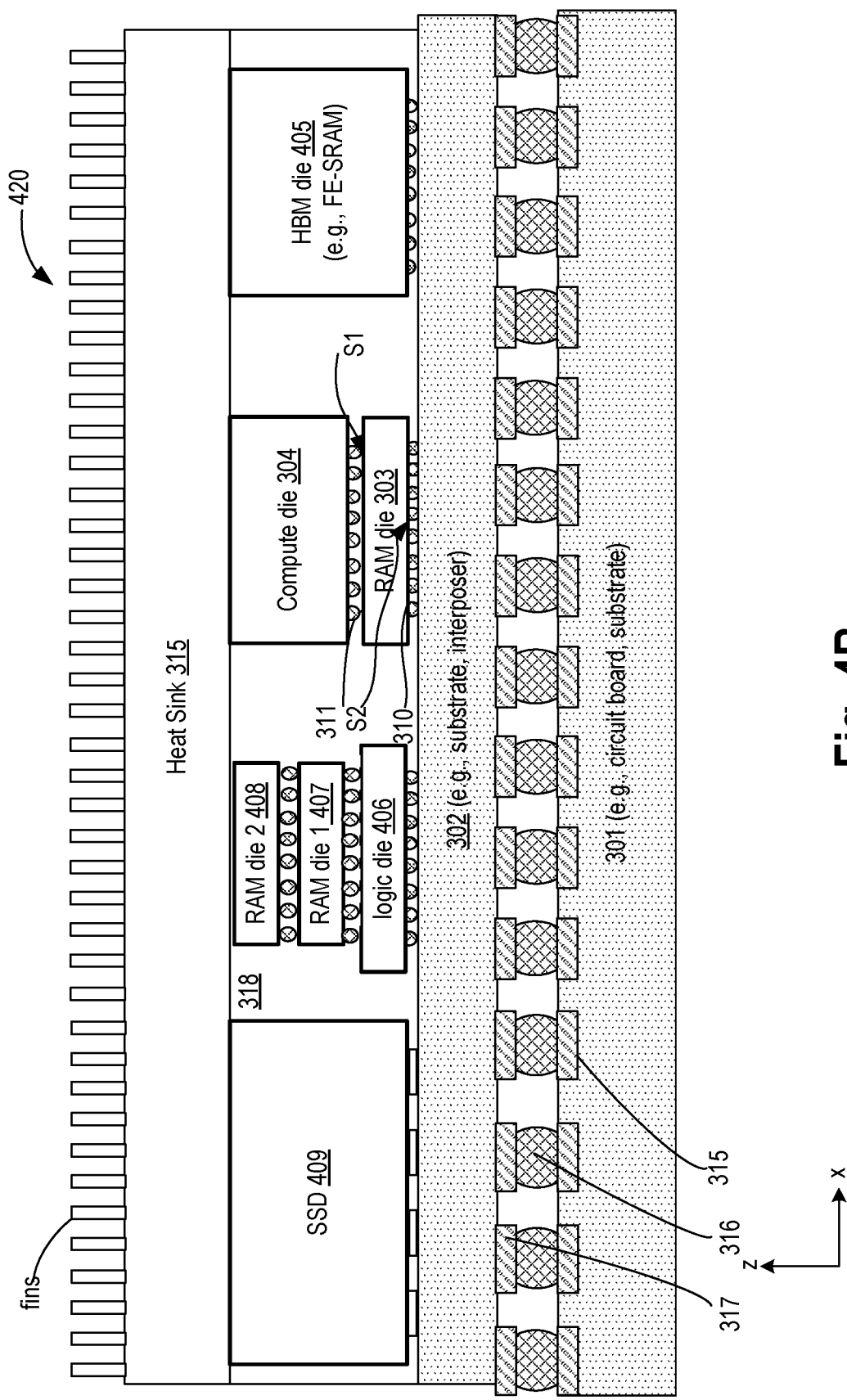
FIG. 4B illustrates a cross-section of a package comprising an AI machine, which includes an SOC having a computational block, which includes a compute die over a memory, a processor, and a solid-state memory, in accordance with some embodiments.

FIG. 4B illustrates a cross-section of package 420 comprising an AI machine, which includes an SOC having a computational block, which includes a compute die over a memory, a processor, and a solid-state memory, in accordance with some embodiments. Package 420 is similar to package 400 but for incorporating SSD 409 within a single package under a common heat sink 315. In this case, a single packaged SOC provides an AI machine which includes the capability of generating a training model and then using the trained model for different data to generate output.

Figure 5:
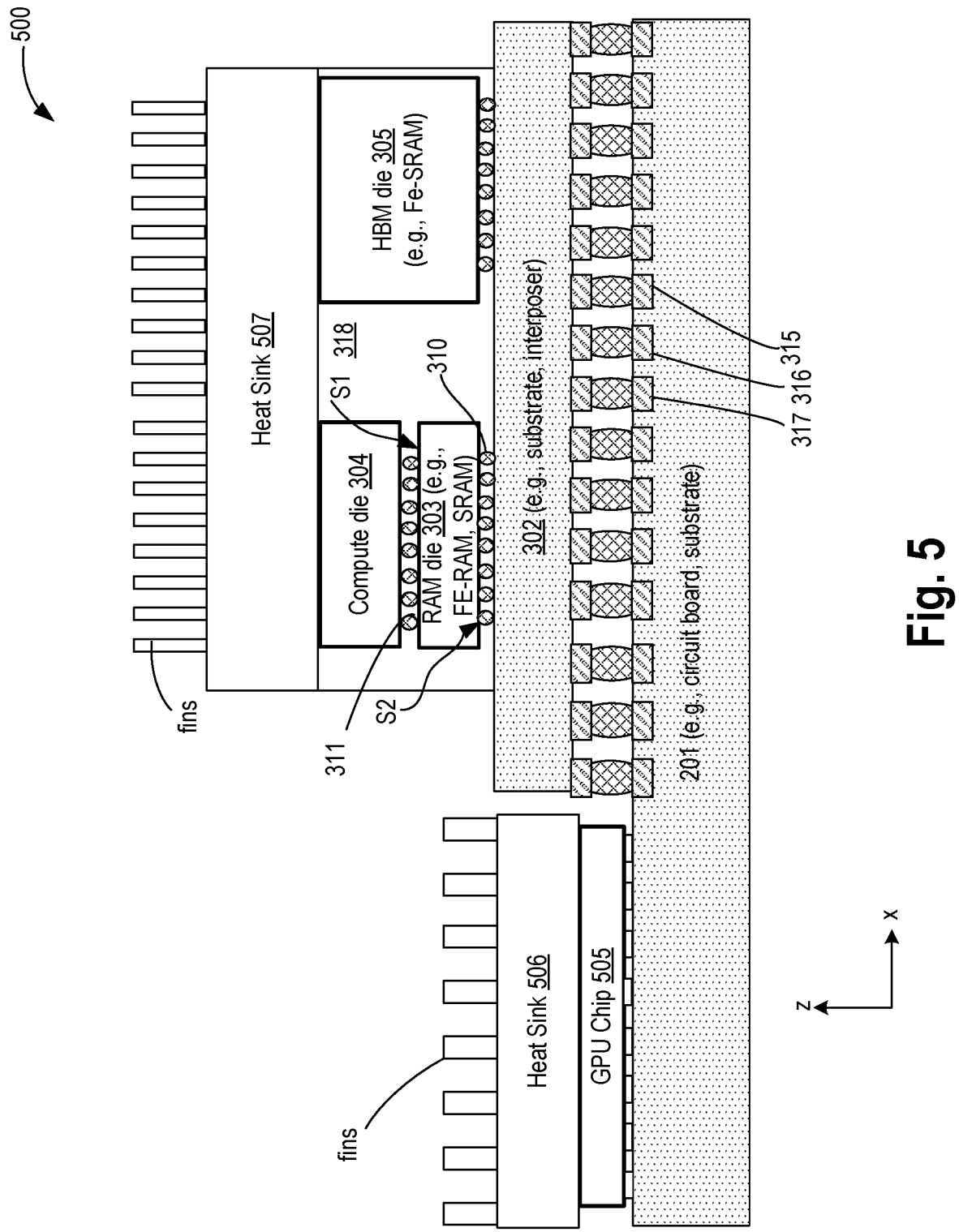
FIG. 5 illustrates a cross-section of multiple packages on a circuit board, where one of the packages includes a compute die over a memory die, and another of the packages includes a graphics processor unit, in accordance with some embodiments.

FIG. 5 illustrates a cross-section 500 of multiple packages on a circuit board, where one of the packages includes a compute die over a memory die, and another of the packages includes a graphics processor unit, in accordance with some embodiments. In this example, an AI processor such as CPU or GPU chip 505 is coupled to substrate 301 (e.g., PCB). Here, two packages are shown—one with heat sink 506 and the other with heat sink 507. Heat sink 506 is a dedicated thermal solution for CPU or GPU chip 505 while heat sink 507 provides a thermal solution for the computational block (memory die 303 and compute die 304) with HBM 305.

Figure 6:
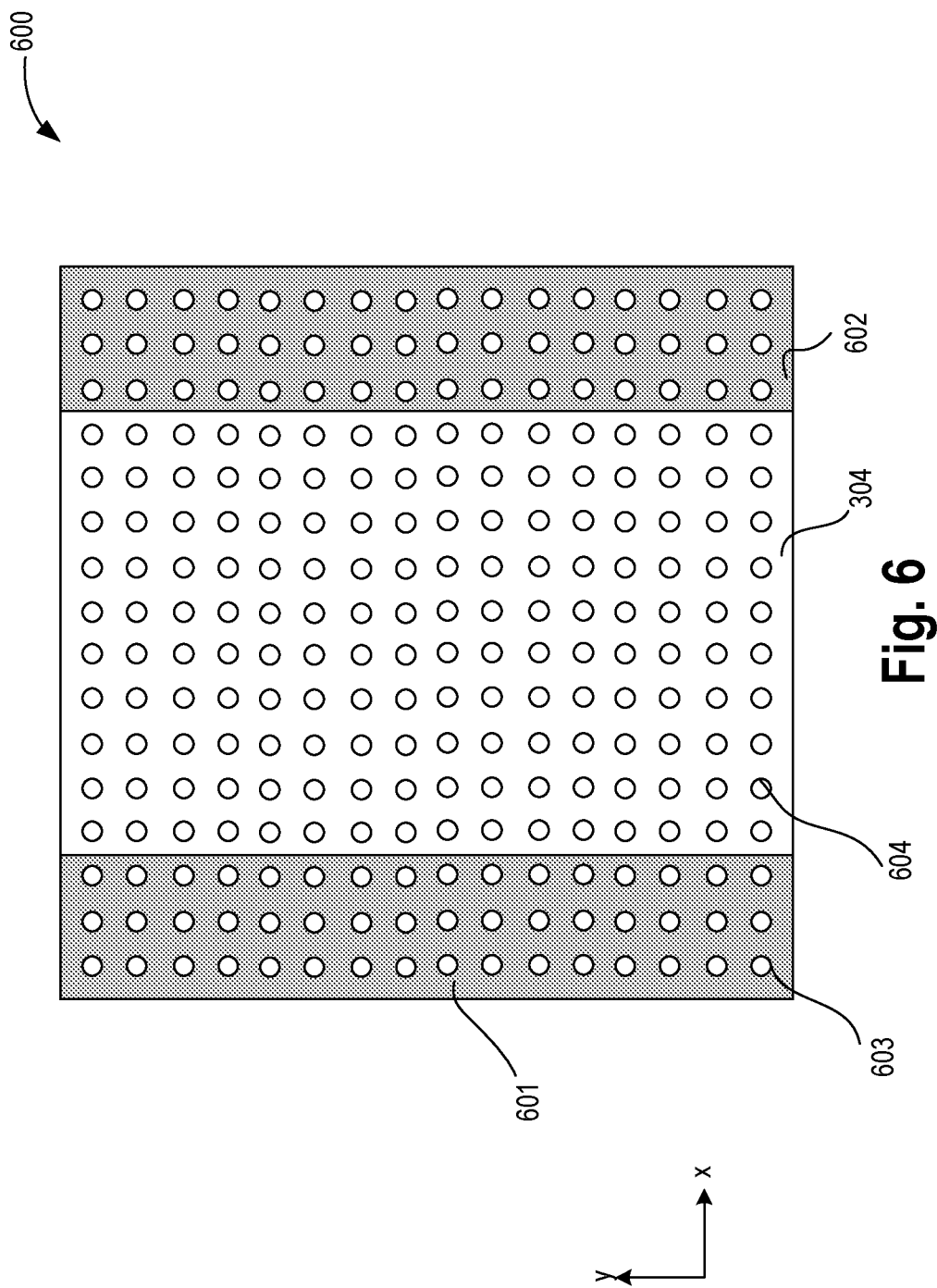
FIG. 6 illustrates a cross-section of a top view of the compute die with micro-humps on the sides to connect with memories along a horizontal plane, in accordance with some embodiments.

FIG. 6 illustrates a cross-section of a top view 600 of compute die 304 with micro-humps on the sides to connect with memories along a horizontal plane, in accordance with some embodiments. The shaded regions 601 and 602 on either side of compute die 304 include micro-bumps 603 (e.g., 310) that are used to connect to memories on either side of compute die 304. For example, as shown in FIG. 3E, HBM 354 and 355 are coupled to compute die 304 via micro-bumps 603. Micro-bumps 604 may be used to connect to substrate 302 or interposer 302.

Figure 7:
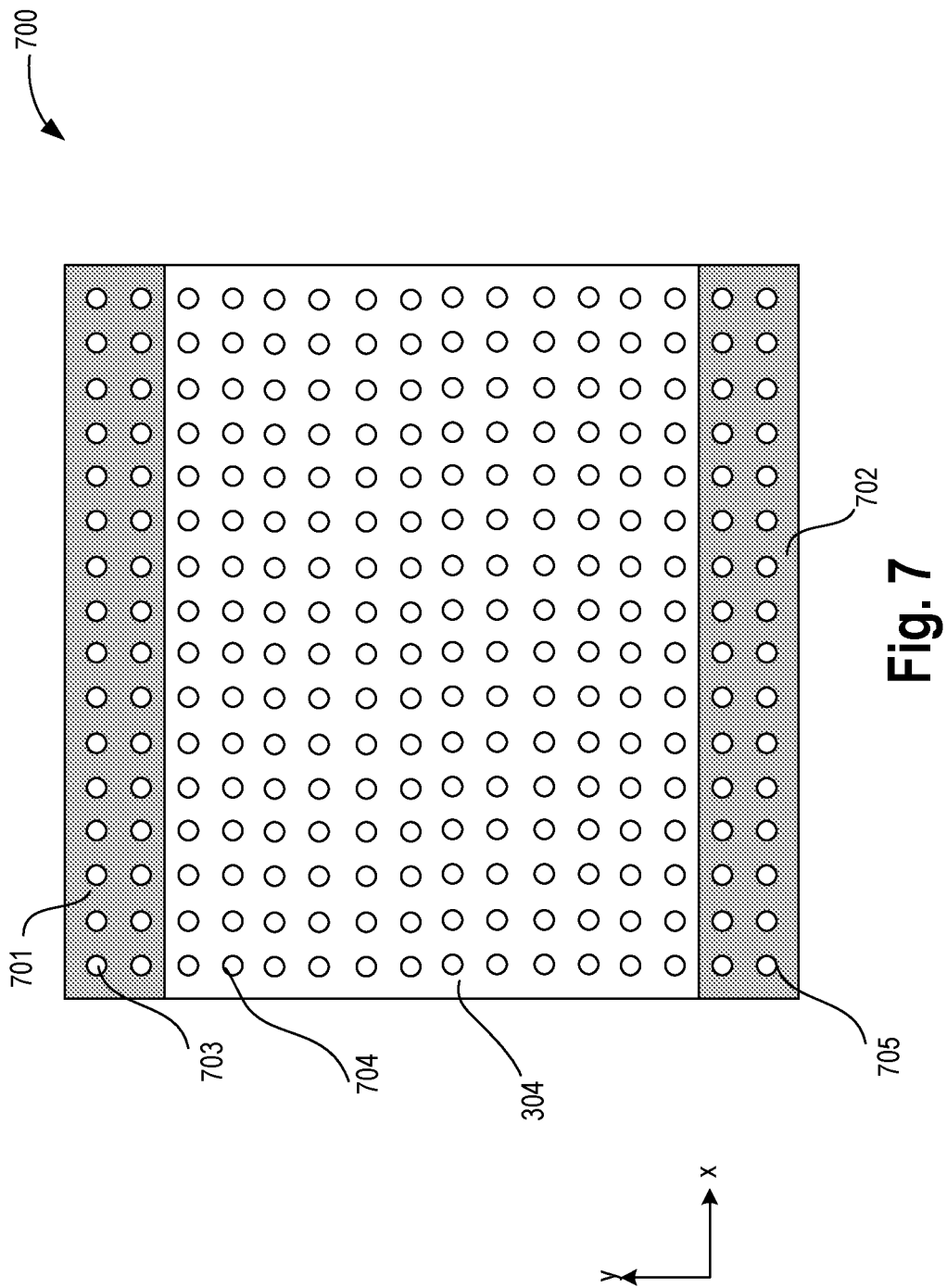
FIG. 7 illustrates a cross-section of a top view of the compute die with micro bumps on the top and bottom of the compute die to connect with memory dies along a vertical plane of the package, in accordance with some embodiments.

FIG. 7 illustrates a cross-section of a top view 700 of compute die 304 with micro bumps on the top and bottom of the compute die to connect with memory dies along a vertical plane of the package, in accordance with some embodiments. The shaded regions 701 and 702 on upper and lower side sections of compute die 304 include micro-bumps 703 (e.g., front-side and back-side via interconnections 311*a* and 311*b*, respectively) that are used to connect to upper and lower memories 345 and 343, respectively. For example, as shown in FIG. 3E, FE-RAMs 343 and 345 are coupled to compute die 304 via micro-bumps for front-side and back-side via interconnections 311*a* and 311*b*, respectively. Micro-bumps 704 may be used to connect to substrate 302 or interposer 302.

Figures 8A, 8B:
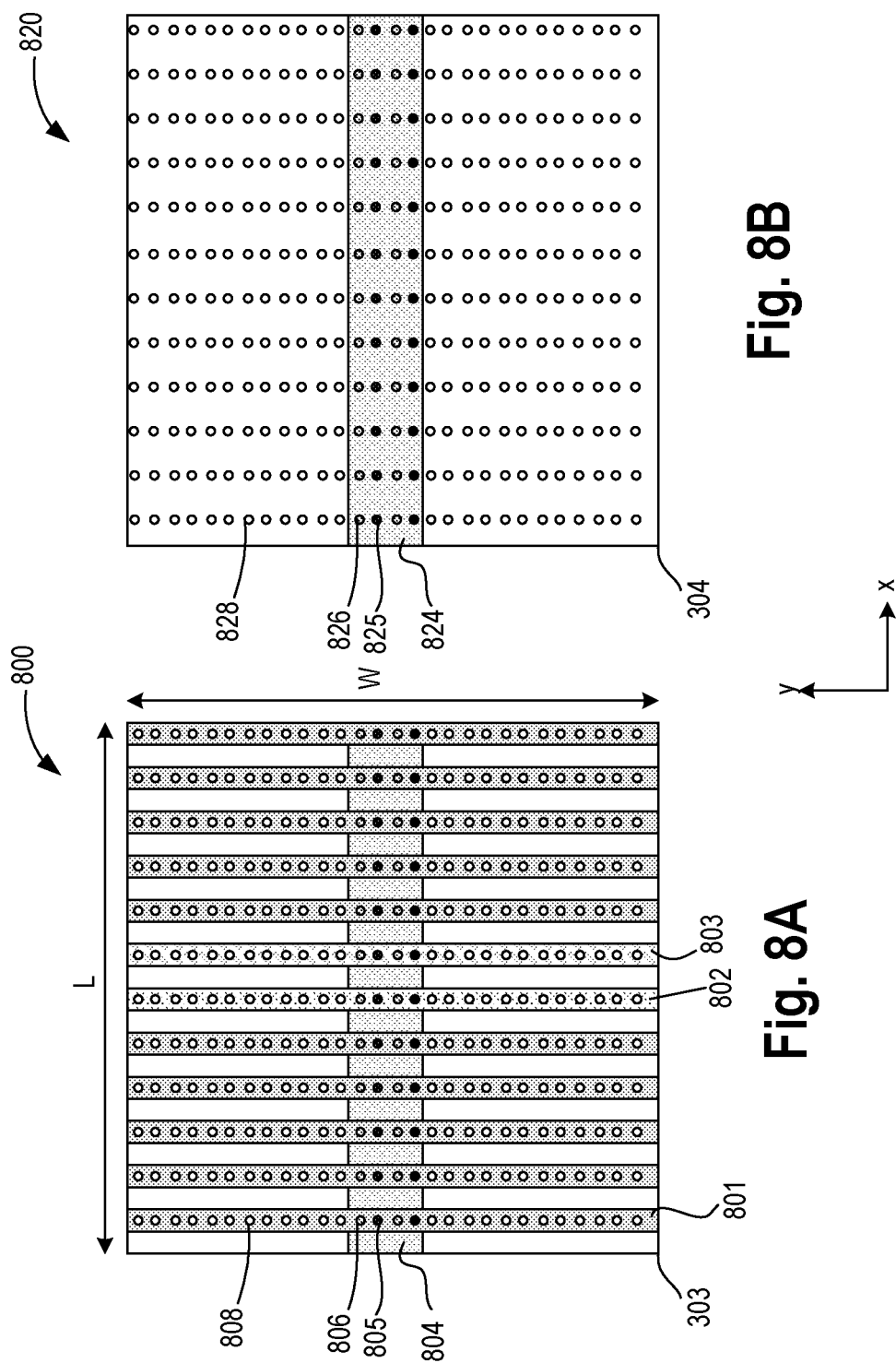
FIG. 8A illustrates a cross-section of a memory die, which is below the compute die, in accordance with some embodiments.
FIG. 8B illustrates a cross-section of a compute die, which is above the memory die, in accordance with some embodiments.

FIG. 8A illustrates a cross-section 800 of a memory die (e.g., 303 or 333), which is below compute die 304, in accordance with some embodiments. Memory die 303 has a pitch of L×W. Cross-section 800 shows strips of TSVs that are used to connect to compute die 304. Strips of shade 801 carry signals while strips 802 and 803 carry power and ground lines. Strip 804 provides power and ground signals 805 and 806 to the memory cells within a row. TSVs 808 connect signals (e.g., word-line) to memory bit cells.

FIG. 8B illustrates a cross-section 820 of a compute die (e.g., 304), which is above the memory die (e.g., memory die 303), in accordance with some embodiments. TSVs 828 may couple to TSVs 808 while strip 824 is over strip 804. TSVs 825 and 826 couple to TSVs for power and ground signals 805 and 806, respectively.

FIG. 9A illustrates cross-section 900 of a memory die 303 with 2×2 tiles, which is below the compute die, in accordance with some embodiments. While memory die 202 of FIG. 8A illustrates a single tile, here 2×2 tile is used for organizing the memory. This allows to cleanly partition the memory for storing data and weights. Here, a tile is indicated by tile 901. The embodiments are not limited to 2×2 tiles and organization of M×N tiles (where M and N are integers that may be equal or different).

FIG. 9B illustrates cross-section 920 of a compute die with 2×2 tiles, which is above the memory die, in accordance with some embodiments. Like memory die 303, compute die 304 can also be partitioned into tiles. Each tile 921 is like a compute die 304 of FIG. 8B, in accordance with some embodiments. Such an organization of compute die 304 allows to run different training models with different input data and weight simultaneously or in parallel.

Figure 10:
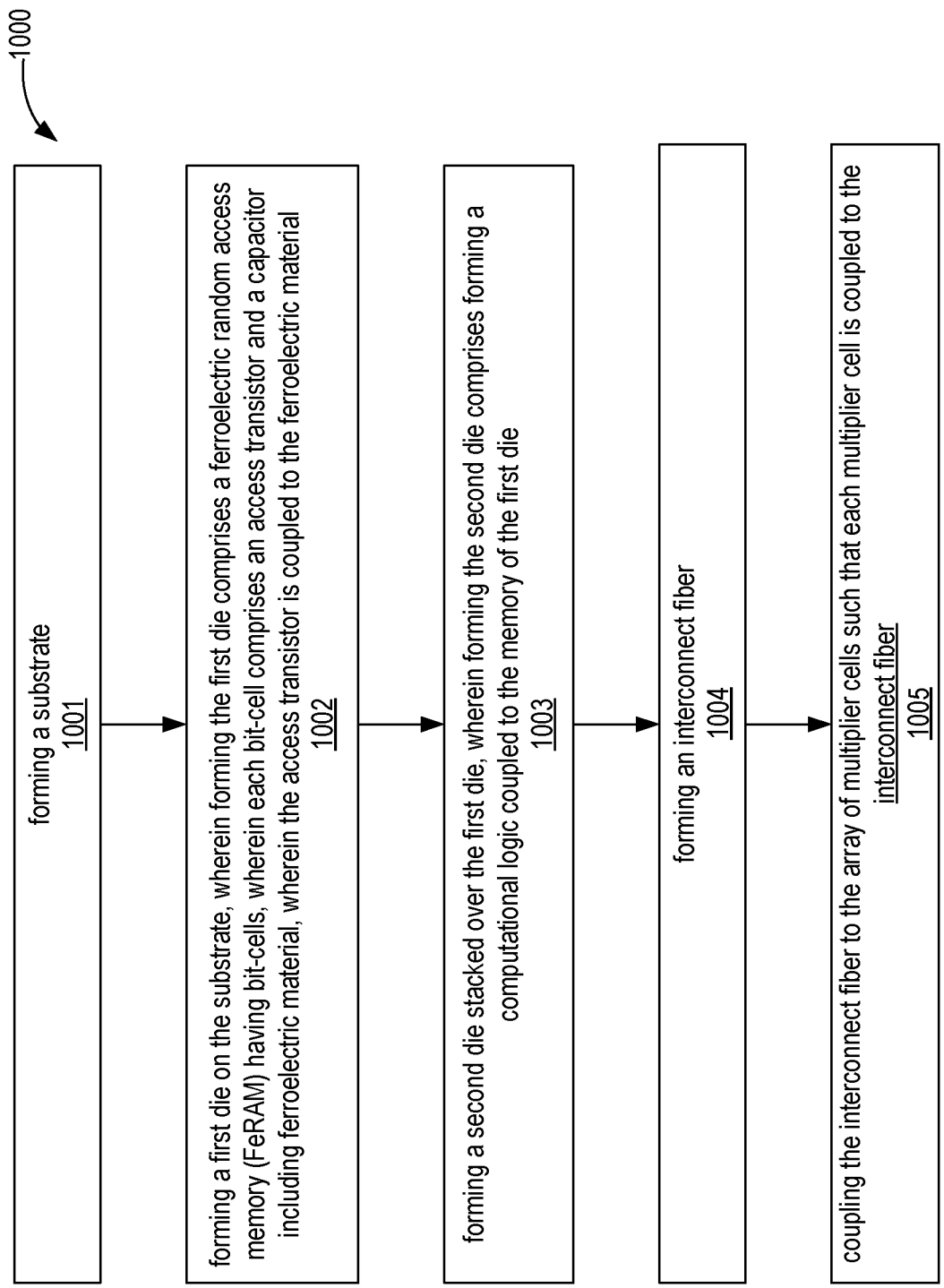

FIG. 10 illustrates a flowchart 1000 of a method of forming a package of a computational block, which includes a compute die (e.g., an inference logic die) above a memory die, in accordance with some embodiments. The blocks in the flowchart 1000 are illustrated in a particular order. However, the order of the various processing steps can be modified without changing the essence of the embodiments. For example, some processing blocks may be processed simultaneously, while others may be performed out of order.

At block 1001, a substrate (e.g., 301) is formed. In some embodiments, substrate 301 is package substrate. In some embodiments, substrate 301 is an interposer (e.g. active or passive interposer). At block 1002, a first die (e.g., memory die 303) is formed on the substrate. In some embodiments, forming the first die comprises a ferroelectric random-access memory (FeRAM) having bit-cells, wherein each bit-cell comprises an access transistor and a capacitor including ferroelectric material, wherein the access transistor is coupled to the ferroelectric material. At block 1003, a second die (e.g., compute die 304) is formed and stacked over the first die, wherein forming the second die comprises forming a computational logic coupled to the memory of the first die. In some embodiments, forming the computational logic includes forming an array of multiplier cells, and wherein the FeRAM includes an array of memory bit-cells.

At block 1004, an interconnect fiber is formed. At block 1005, the interconnect fiber is coupled to the array of multiplier cells such that each multiplier cell is coupled to the interconnect fiber. In some embodiments, the FeRAM is partitioned into a first partition operable as buffers; and a second partition to store weight factors.

In some embodiments, the method of flowchart 1000 comprises: receiving data by the computational logic from the first partition and the second partition; and providing an output of the computational logic to a logic circuitry. In some embodiments, forming the computational logic comprises forming ferroelectric logic. In some embodiments, the computational logic is operable to multiply at least two matrices. In some embodiments, the method of forming the substrate comprises forming active or passive devices. In some embodiments, the method comprises: forming a third die (e.g., a logic die or a memory) on the substrate. In some embodiments, the method comprises coupling the third die on the substrate. In some embodiments, the method comprises a fourth die comprising dynamic random-access memory (DRAM); and stacking the fourth die over the third die. In some embodiments, the method comprises coupling a heat sink to the second die.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a substrate; a first die on the substrate, wherein the first die comprises a ferroelectric random access memory (FeRAM) having bit-cells, wherein each bit-cell comprises an access transistor and a capacitor including ferroelectric material, wherein the access transistor is coupled to the ferroelectric material; and a second die stacked over the first die, wherein the second die comprises a computational logic coupled to the memory of the first die.

Example 2: The apparatus of example 1, wherein the computational logic includes an array of multiplier cells, and wherein the FeRAM includes an array of memory bit-cells.

Example 3: The apparatus of example 2 comprising an interconnect fiber coupled to the array of multiplier cells such that each multiplier cell is coupled to the interconnect fiber.

Example 4: The apparatus of example 1, wherein the memory is partitioned into a first partition operable as buffers; and a second partition to store weight factors.

Example 5: The apparatus of example 4, wherein the computational logic is to receive data from the first partition and the second partition, and wherein an output of the computational logic is received by logic circuitry.

Example 6: The apparatus of example 4, wherein the computational logic comprises ferroelectric logic.

Example 7: The apparatus of example 4 wherein the computational logic is operable to multiply at least two matrices.

Example 8: The apparatus of example 1, wherein the substrate comprises active or passive devices.

Example 9: The apparatus of example 1, wherein a third die is coupled on the substrate, and wherein a fourth die comprising dynamic random access memory (DRAM) is stacked over the third die.

Example 10: The apparatus of example 1, wherein a heat sink is coupled to the second die.

Example 11: A method comprising: forming a substrate; forming a first die on the substrate, wherein forming the first die comprises a ferroelectric random access memory (FeRAM) having bit-cells, wherein each bit-cell comprises an access transistor and a capacitor including ferroelectric material, wherein the access transistor is coupled to the ferroelectric material; and forming a second die stacked over the first die, wherein forming the second die comprises forming a computational logic coupled to the memory of the first die.

Example 12: The method of example 11, wherein forming the computational logic includes forming an array of multiplier cells, and wherein the FeRAM includes an array of memory bit-cells.

Example 13: The method of example 12 comprising: forming an interconnect fiber; and coupling the interconnect fiber to the array of multiplier cells such that each multiplier cell is coupled to the interconnect fiber.

Example 14: The method of example 11, wherein the FeRAM is partitioned into a first partition operable as buffers; and a second partition to store weight factors.

Example 15: The method of example 14 comprises: receiving data by the computational logic from the first partition and the second partition; and providing an output of the computational logic to a logic circuitry.

Example 16: The method of example 14, wherein forming the computational logic comprises forming ferroelectric logic, wherein the computational logic is operable to multiply at least two matrices.

Example 17: The method of example 11, wherein forming the substrate comprises forming active or passive devices.

Example 18: The method of example 11 comprises: forming a third die; coupling the third die on the substrate; forming a fourth die comprising dynamic random access memory (DRAM); and stacking the fourth die over the third die.

Example 19: The method of example 11, comprising coupling a heat sink to the second die.

Example 20: A system comprising: a first memory comprising non-volatile memory cells; a second memory comprising dynamic random access memory (DRAM), wherein the first memory is coupled to the second memory; a third memory comprising ferroelectric random access memory (FeRAM), wherein the third memory is coupled to the first memory; a first processor coupled to the second memory; and a second processor coupled to the third memory and the first processor, wherein the second processor comprises: a substrate; a first die on the substrate, wherein the first die comprises a ferroelectric random access memory (FeRAM) having bit-cells, wherein each bit-cell comprises an access transistor and a capacitor including ferroelectric material, wherein the access transistor is coupled to the ferroelectric material; and a second die stacked over the first die, wherein the second die comprises a multiplier coupled to the memory of the first die.

Example 21: The system of example 20, wherein the multiplier includes an array of multiplier cells, and wherein the FeRAM includes an array of memory bit-cells, wherein each multiplier cell is coupled to corresponding memory bit-cell.

Example 22: The system of example 21, wherein the second processor comprises an interconnect fiber coupled to the array of multiplier cells such that each multiplier cell is coupled to the interconnect fiber.

Example 23: An apparatus comprising: an interposer; a first die on the interposer, wherein the first die comprises a random access memory (RAM) having bit-cells; and a second die stacked over the first die, wherein the second die comprises a matrix multiplier coupled to the memory of the first die.

Example 24: The apparatus of example 23, wherein the matrix multiplier includes an array of multiplier cells, and wherein the RAM includes an array of memory bit-cells, and wherein each multiplier cell is coupled to corresponding memory bit-cell.

Example 25: The apparatus of example 23, wherein the second die comprises a logic circuitry coupled to the matrix multiplier.

Example 26: The apparatus of example 25, wherein the second die comprises a buffer coupled to the logic circuitry, and wherein the buffer is coupled to the memory.

Example 27: The apparatus of example 23, wherein the memory comprises a ferroelectric random access memory (FeRAM) having bit-cells, wherein each bit-cell comprises an access transistor and a capacitor including ferroelectric material, wherein the access transistor is coupled to the ferroelectric material.

Example 28: The apparatus of example 23, wherein the memory comprises a static random access memory (SRAM) having bit-cells.

Example 29: The apparatus of example 23, wherein a heat sink is coupled to the second die.

Example 30: The apparatus of example 23, wherein the interposer comprises memory coupled to the second die.

Example 31: An apparatus comprising: an interposer; a first die on the interposer, wherein the first die comprises a random access memory (RAM) having bit-cells with ferroelectric material; a second die next to the first die and on the interposer, wherein the second die comprises a computational logic electrically coupled to the memory of the first die; and a third die on the interposer, wherein the third die comprises RAM having bit-cells, wherein the third die is next to the second die.

Example 32: The apparatus of example 31, wherein the interposer comprises a RAM electrically coupled to the second die.

Example 33: The apparatus of example 31, wherein the RAM of the third die comprises ferroelectric material.

Example 34: The apparatus of example 31, wherein the computational logic includes a matrix multiplier which includes an array of multiplier cells.

Example 35: The apparatus of example 34, wherein the second die comprises a logic circuitry coupled to the matrix multiplier.

Example 36: The apparatus of example 35, wherein the second die comprises a buffer coupled to the logic circuitry, and wherein the buffer is coupled to the first or second dies.

Example 37: The apparatus of example 31, wherein the at least one bit-cell of the first die comprises an access transistor and a capacitor including the ferroelectric material, wherein the access transistor is coupled to the ferroelectric material.

Example 38: The apparatus of example 31, wherein the RAM of the third die comprises a static random access memory (SRAM) having bit-cells.

Example 39: The apparatus of example 31, comprises a heat sink coupled to the first, second, and third dies.

Example 40: A method comprising: forming an interposer; forming a first die on the interposer, wherein forming the first die comprises forming a random access memory (RAM) having bit-cells with ferroelectric material; forming a second die next to the first die and on the interposer, wherein forming the second die comprises: forming a computational logic; and electrically coupling to the memory of the first die with the computational logic; forming a third die on the interposer, wherein forming the third die comprises forming RAM having bit-cells; and positioning the third die next to the second die.

Example 41: The method of example 40, wherein forming the interposer comprises forming a RAM inside the interposer; wherein the method comprises electrically coupling the RAM to the second die.

Example 42: The method of example 40, wherein the RAM of the third die comprises ferroelectric material.

Example 43: The method of example 40, wherein forming the computational logic includes forming a matrix multiplier, which includes an array of multiplier cells.

Example 44: The method of example 43, wherein forming the second die comprises forming a logic circuitry; and wherein the method comprises coupling the logic circuitry to the matrix multiplier.

Example 45: The method of example 44, wherein forming the second die comprises forming a buffer; and coupling the buffer to the logic circuitry, and wherein method comprises coupling the buffer to the first or second dies.

Example 46: The method of example 40, wherein the at least one bit-cell of the first die comprises an access transistor and a capacitor including the ferroelectric material, and wherein the access transistor is coupled to the ferroelectric material.

Example 47: The method of example 40, wherein forming the RAM of the third die comprises forming a static random access memory (SRAM) having bit-cells.

Example 48: The method of example 40, comprises coupling a heat sink to the first, second, and third dies.

Example 49: A system comprising: a first memory comprising non-volatile memory cells; a second memory comprising dynamic random access memory (DRAM), wherein the first memory is coupled to the second memory; a third memory comprising ferroelectric random access memory (FeRAM), wherein the third memory is coupled to the first memory; a first processor coupled to the second memory; and a second processor coupled to the third memory and the first processor, wherein the second processor comprises: an interposer; a first die on the interposer, wherein the first die comprises a random access memory (RAM) having bit-cells with ferroelectric material; a second die next to the first die and on the interposer, wherein the second die comprises a computational logic electrically coupled to the memory of the first die; and a third die on the interposer, wherein the third die comprises RAM having bit-cells, wherein the third die is next to the second die.

Example 50: The system of example 49, wherein the interposer comprises a RAM electrically coupled to the second die, and wherein the RAM of the third die comprises ferroelectric material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A method comprising:

forming a substrate having a top surface;

forming a first die directly on the top surface of the substrate through bumps or vias, wherein the first die comprises a ferroelectric random-access memory (FeRAM) having bit-cells, wherein each bit-cell comprises an access transistor and a capacitor including ferroelectric material, and wherein the access transistor is coupled to the ferroelectric material;

forming a second die vertically stacked over the first die, wherein the second die comprises a computational logic including an array of multiplier cells, and wherein the computational logic is coupled to the FeRAM of the first die;

forming a first silicon structure adjacent to the second die but not vertically stacked with the second die, wherein the first silicon structure comprises first active and/or passive devices; and forming a second silicon structure adjacent to the second die but not vertically stacked with the second die, wherein the first silicon structure and the second silicon structure are on either side of the second die, wherein the second silicon structure comprises second active and/or passive devices;

wherein:

the first die has a first surface;

the second die has a second surface;

the first surface is to face the second surface such that the first surface is to substantially overlap the second surface or the second surface is to substantially overlap the first surface; and the first die and the second die are connected via inter-die copper pillars which are not solder bumps, wherein the first die includes first through-silicon vias, and wherein the second die includes second through-silicon vias.

2. The method of claim 1 further comprises:

coupling the first through-silicon vias of the FeRAM of the first die to all or part of the inter-die copper pillars.

3. The method of claim 1 further comprises:

coupling the second through-silicon vias of the FeRAM of the second die to all or part of the inter-die copper pillars.

4. The method of claim 1 further comprises:

coupling a heat spreader over the second die, the first silicon structure and the second silicon structure.

5. The method of claim 1, wherein the first die includes SRAM.

6. The method of claim 1, wherein the computational logic is operable to multiply at least two matrices.

7. The method of claim 1 further comprising coupling an interconnect fiber to the array of multiplier cells such that each multiplier cell is coupled to the interconnect fiber.

* * * * *